United States Patent
Murata et al.

[11] Patent Number: 5,955,209
[45] Date of Patent: Sep. 21, 1999

[54] THIN-FILM ELECTROLUMINESCENT DEVICE

[75] Inventors: Hideyuki Murata; Takahiro Fujiyama, both of Sodegaura; Shogo Saito, Fukuoka; Tetsuo Tsutsui, Kasuga; Tooru Yamanaka, Sodegaura, all of Japan

[73] Assignee: Mitsui Petrochemical Industries, Ltd., Tokyo, Japan

[21] Appl. No.: 08/643,558

[22] Filed: May 6, 1996

Related U.S. Application Data

[63] Continuation of application No. 08/234,373, Apr. 28, 1994, abandoned.

[30] Foreign Application Priority Data

Apr. 28, 1993 [JP] Japan .................................. 5-103038
Jun. 24, 1993 [JP] Japan .................................. 5-153545

[51] Int. Cl.$^6$ .................................................. H05B 33/14
[52] U.S. Cl. .......................... 428/690; 428/691; 428/917; 313/503; 313/504; 313/506
[58] Field of Search ................... 428/690, 691, 428/917; 313/503, 504, 506

[56] References Cited

U.S. PATENT DOCUMENTS

| | | | |
|---|---|---|---|
| 4,123,269 | 10/1978 | Van Hoene et al. | 96/1 PC |
| 4,233,384 | 11/1980 | Turner et al. | 430/59 |
| 4,251,612 | 2/1981 | Chu et al. | 430/59 |
| 4,273,846 | 6/1981 | Pai et al. | 430/59 |
| 4,275,132 | 6/1981 | Chu et al. | 430/31 |
| 4,588,666 | 5/1986 | Stoklka et al. | 430/59 |
| 4,720,432 | 1/1988 | Van Slyke et al. | 428/457 |
| 5,382,477 | 1/1995 | Saito et al. | 428/690 |

FOREIGN PATENT DOCUMENTS

| | | |
|---|---|---|
| 0439627 | 8/1991 | European Pat. Off. . |
| 0443861 | 8/1991 | European Pat. Off. . |
| 0449125 | 10/1991 | European Pat. Off. . |
| 54-064299 | 5/1979 | Japan . |
| 61-098303 | 5/1986 | Japan . |
| 4-274693 | 9/1992 | Japan . |
| 1577237 | 10/1980 | United Kingdom . |

OTHER PUBLICATIONS

Hamada et al, "Evaluation of Oxadiazole Derivatives as Organic EL Materials", The Chemical Soc. of Japan, 1991 (11) pp. 1540–1548.
Appl. Phys Lett. 51 (12), 1987, pp. 913–915.
Japanese Journal of Applied Physics, vol. 27, No. 2, 1988, pp. L269–L271.
Japanese Journal of Applied Physics, vol. 27, No. 4, 1988, pp. L713–L715.
Chem. Mater 1991, vol. 3, pp. 709–714.
Journal of Imaging Science, vol. 29, No. 2, 1985, pp. 69–72.
Chemistry Letters, 1989, pp. 1145–1148.
J. Vac. Sci. Technol. A5 (4), 1987, pp. 2253–2256.

*Primary Examiner*—Charles Nold
*Attorney, Agent, or Firm*—Birch, Stewart, Kolasch & Birch, LLP

[57] ABSTRACT

The thin-film electroluminescent device of the present invention comprises a thin film of a polyoxadiazole derivative represented by the formula:

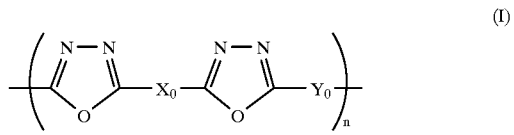

(I)

wherein each of $X_0$ and $Y_0$ independently represents a divalent organic group which may comprise a silicon atom, and n is an integer of 2 or greater, formed as an electroluminescent layer or a charge injecting/transporting layer between electrodes, at least one thereof being transparent. This thin-film electroluminescent device is excellent not only in electroluminescence and capability of charge injection/transport to thereby ensure high light emission efficiency but also in durability such as heat resistance.

18 Claims, 2 Drawing Sheets

THIN-FILM ELECTROLUMINESCENT DEVICE

This application is a continuation of application Ser. No. 08/234,373 filed on Apr. 28, 1994, now abandoned.

FIELD OF THE INVENTION

The present invention relates to an organic electroluminescent material for use in data display, optical data processing and other fields, an electroluminescent device or display device prepared with the use of the organic electroluminescent material.

BACKGROUND OF THE INVENTION

In data display, optical data processing and other fields, recent attention is drawn to organic electroluminescent materials. Any of the electroluminescent materials emits light having a wavelength and an intensity characteristic of the material when it is sandwiched between electrodes and a voltage is applied thereto. It is believed that electrons and holes are injected from the respective electrodes into the organic electroluminescent material and moved in the organic electroluminescent material by the applied voltage, followed by recombination of the holes and electrons. The emitted light has a spectrum nearly identical with a fluorescence spectrum intrinsic for the electroluminescent material.

Organic and inorganic electroluminescent materials are known. The organic electroluminescent materials include blue electroluminescence-inducing anthracene known from old. The inorganic electroluminescent materials include well known semiconductors. Now, LED (light emitting diode) inducing red or yellow electroluminescence is drawing attention as a highly bright and stable electroluminescent material, among the electroluminescent semiconductors. LEDs inducing red, orange and green electroluminescences are combined to put into practical use as a three-color display for streets. Appl. Phys. Lett., Vol. 51, No. 12 (1987), pp 913–915 describes a two-layer electroluminescent device (EL device) prepared with the use of organic electroluminescent materials. This two-layer electroluminescent device is prepared by successively forming on an electrode of ITO (indium tin oxide) a hole injecting layer, an electroluminescent layer capable of transporting electrons and an electron injecting electrode of MgAg alloy according to vapor deposition. When a voltage of several tens of Volts is applied to this electroluminescent device, electrons and holes are injected into the electroluminescent layer to thereby emit light. With this two-layer electroluminescent device, the color of emitted light can be changed by choosing the type of the electroluminescent material. For example, a low molecular compound of an aluminum quinolinol complex (Alq3) is used as the electroluminescent material. Green electroluminescence is obtained by the use of the aluminum quinolinol complex as the electroluminescent material.

However, this two-layer electroluminescent device has a drawback in that as an electroluminescent layer the above low molecular compound deposited is crystallized to cause detachment of the organic layer (electroluminescent layer) from the electrode to thereby no longer emit light. There is another drawback that the two-layer electroluminescent device generates heat accompanied with the emission of light to markedly increase the temperature of the device, so that the device is deteriorated.

Saito et al. have proposed a three-layer organic electroluminescent (EL) device for improving electroluminescene efficiency (Jpn. J. Appl. Phys., Vol. 27, No. 2, 1988, pp. L269–L271 and Jpn. J. Appl. Phys., Vol. 27, No. 4, 1988, pp. L713–L715). This three-layer organic electroluminescent device is prepared by successively forming on an ITO electrode (positive electrode) a hole injecting layer, an electroluminescent layer, an electron injecting layer and an MgAg electrode (negative electrode). In this multi-layered structure, the hole injecting layer, the electroluminescent layer and the electron injecting layer are composed of organic layers. In this EL device, the injection efficiency of holes from the positive electrode into the electroluminescent layer is improved by the hole injecting layer, and the injection efficiency of electrons from the negative electrode into the electroluminescent layer is improved by the electron injecting layer. Consequently, the threshold voltage required for the electroluminescence of the three-layer organic electroluminescent device is only several Volts, and blue electroluminescence having been difficult with inorganic materials can be attained with this three-layer organic electroluminescent device at the threshold voltage comparable to that with the above two-layer organic electroluminescent device.

However, this three-layer organic electroluminescent device uses organic low molecular compounds, such as oxadiazoles each having a single oxadiazole ring, as materials capable of hole injection or electron transport. Most of these low molecular organic compounds have melting points as low as up to 300° C. Therefore, disadvantageously, the three-layer organic electroluminescent device prepared with the use of the above low molecular organic compounds has poor heat resistance to thereby suffer from thermal degradation of properties, or recrystallization occurs in the device to cause degradation of the same.

It has been proposed to form at least one of the organic layers, which are electron injecting (transporting) layer, the electroluminescent layer and the hole injecting (transporting) layer with the use of a polymeric thin film for avoiding the above thermal degradation and recrystallization in the electroluminescent device. For example, in Japanese Patent Laid-Open Publication No. 2096/1992, a process for producing a polymeric thin film EL device is proposed in which a polymeric thin film comprising an electroluminescent low molecular weight material or a low molecular weight material capable of hole injection and electron transport is formed by a wet process, such as spin coating or dip coating. Several tens of Volts must be applied to the thus obtained for providing effective electroluminescent brightness. Even if this high voltage is applied, the electroluminescent brightness is only up to 200 cd/m$^2$.

In the formation of the above polymeric thin film by spin coating, there is a drawback such that pin holes are likely to form in the preparation of polymeric thin film, pin holes which cause the device to break during the driving of the device.

Further, the formation of the polymeric thin film according to the wet process is likely to contain impuirities into the device. The impurities accelerate the degradation of the device.

Although the formation of polymer layer by wet process is easy to make the device, the process is not suitable for making the device. Because when the electroluminescent device is produced by forming an organic layer (upper layer) on an organic layer (under layer) according to the wet process, it is requisite to select a solvent which does not dissolve or leach the organic under layer in the preparation of a coating fluid for forming the upper organic layer. In the formation of an organic layer (upper layer) on an organic layer (under layer) according to the wet process, the materials usable for forming the under layer and the upper layer and the solvents for dissolving the materials are limited. Consequently, there is a problem that the types of the polymeric materials capable of forming the organic layer of the polymeric thin-film electroluminescent device and the low molecular materials which can be contained in the polymeric materials are extremely limited.

On the other hand, in Japanese Patent Laid-Open Publication No. 274693/1992, it is proposed to use, as an electroluminescent layer or a charge injecting/transporting layer of an electroluminescent device, a thin film of a polyimide represented by the formula:

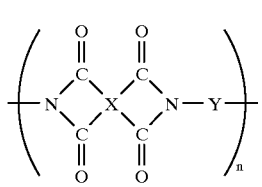
(IX)

wherein X and Y are as defined below, and n is an integer indicating the degree of polymerization, the polyimide being prepared through a polyamic acid (polyimide precursor) by reacting an acid dianhydride represented by the formula:

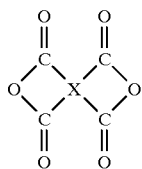
(VII)

wherein X represents an organic group including an aromatic, with a diamino compound represented by the formula:

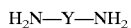

$H_2N—Y—NH_2$ (VIII)

wherein Y represents an organic group having EL function (at least one of charge injecting, charge transporting and electroluminescent functions) according to the vapor deposition polymerization process.

In the above polyimide of the formula (IX) indicates that the nitrogen atom forming $sp^3$ hybrid orbital and the carbon atom of the carbonyl group constitute σ bond, which forms part of the principal chain of the polyimide. This σ bond part restricts the π electron conjugation chain, so that excellent electron conductivity, thus high electroluminescence, cannot be expected from the electroluminescent device having a thin film of the polyimide as an electroluminescent layer or a charge injecting/transporting layer.

Further, the polyimide represented by the formula (IX) has a carbonyl group with a large dipole moment at the site of the imide bond. This carbonyl group is known to function as a trap of carriers (electrons and/or holes), thereby lowering the mobility of carriers. High electron conductivity cannot be expected from the polymeric thin film having low carrier mobility.

OBJECT OF THE INVENTION

The present invention has been made in the above situation. Thus, the object of the present invention is to provide a thin-film electroluminescent device in which a polymeric thin film excellent not only in electroluminescence and/or capability of charge injection/transport but also in durability, such as heat resistance, is interposed between electrodes.

SUMMARY OF THE INVENTION

In a first aspect of the present invention, there is provided a thin-film electroluminescent device comprising an electroluminescent layer interposed between electrodes, at least one thereof being transparent, wherein the electroluminescent layer comprises polyoxadiazole derivatives, formed by the vapor deposition polymerization process, represented by the formula:

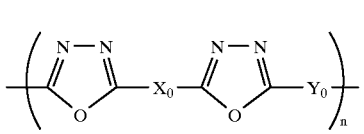
(I)

wherein each of $X_0$ and $Y_0$ independently represents a divalent organic group which may comprise a silicon atom, and n is an integer of 2 or greater.

In a second aspect of the present invention, there is provided a thin-film electroluminescent device comprising an electroluminescent layer interposed between electrodes, at least one thereof being transparent, and a charge injecting/transporting layer interposed between at least one of the electrodes and the electroluminescent layer, wherein at least one of the electroluminescent layer and the charge injecting/transporting layer comprises polyoxadiazole derivatives, formed by the vapor deposition polymerization, represented by the above formula (I).

DETAILED DESCRIPTION OF THE INVENTION

Hereinbelow, the thin-film electroluminescent device according to the present invention will be illustrated with reference to the appended drawings.

Figure 1:
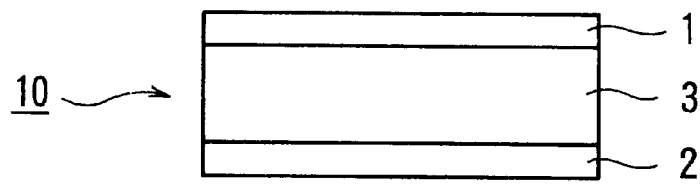
FIG. 1 is a sectional view schematically illustrating the structure of the thin-film electroluminescent device according to the first aspect of the present invention.

FIG. 1 illustrates the thin-film electroluminescent device according to the first aspect of the present invention.

Basically, the thin-film electroluminescent device 10 comprises a multi-layered structure in which an electroluminescent layer 3 is sandwiched between a negative electrode 1 and a positive electrode 2.

The negative electrode 1 is preferably one exhibiting high efficiency of electron injection into the electroluminescent layer 3 and permitting repeated injections of electrons in the electroluminescent layer 3. The negative electrode 1 is composed of, for example, Mg, In, Ca, Al, Li, Sm or MgAg.

The positive electrode 2 is preferably one exhibiting high efficiency of hole (positive charge) injection into the electroluminescent layer 3 and permitting repeated injections of holes in the electroluminescent layer 3. The positive electrode 2 is composed of, for example, ITO, Pt or Au.

At least one of the negative electrode 1 and the positive electrode 2 is transparent, through which irradiation of light emitted in the electroluminescent layer 3 can be transmitted.

Generally, either the negative electrode 1 or the positive electrode 2 is formed on a transparent plate of glass, polymer film, etc.

For example, when the positive electrode 2 is composed of ITO, the ITO electrode is deposited in the form of a thin film on a transparent plate of glass, polymer film, etc.

The thin-film electroluminescent device 10 illustrated in FIG. 1 comprises an electroluminescent layer 3 composed of a thin film of polyoxadiazole derivatives, formed by the vapor deposition polymerization process, represented by the formula:

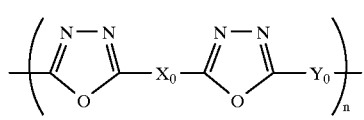

(I)

wherein each of $X_0$ and $Y_0$ independently represents a divalent organic group, which may comprise optionally comprising a silicon atom, and n is an integer of 2 or greater, the thickness of the film is generally from 200 to 2000 Å, preferably from 300 to 800 Å.

The thin film of the polyoxadiazole derivative of the formula (I) contains oxadiazole rings, which themselves have electroluminescent properties. Therefore, in the above formula (I), $X_0$ and $Y_0$ are not limited as long as these are divalent organic groups.

For ensuring higher electroluminescence efficiency of the thin-film electroluminescent device 10, it is desirable that both of $X_0$ and $Y_0$ be electroluminescent divalent organic groups, or that either of $X_0$ and $Y_0$ be an electroluminescent divalent organic group, provided that the other is a divalent organic group capable of electron injection and transport, or provided that the other is a divalent organic group capable of hole injection and transport.

In the formula (I), appropriate species of $X_0$ and $Y_0$ are selected depending on the type of the material composing the negative electrode 1 and/or the positive electrode 2, the wavelength (color) of light emitted from the electroluminescent device layer 3, etc.

Electroluminescence from the thin-film electroluminescent device 10 is believed to occur as follows.

When a voltage is applied between the negative electrode 1 and the positive electrode 2 of the thin-film electroluminescent device 10, electrons are injected from the negative electrode 1 into the electroluminescent layer 3 and migrate through the electroluminescent layer 3, while holes are injected into the electroluminescent layer 3 and migrate through the electroluminescent layer 3. The above electrons and holes are recombined in the electroluminescent layer 3. In the course of the recombination, the electroluminescent layer 3 emits light.

Figure 2:
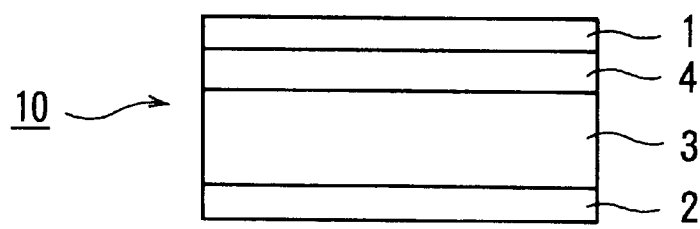
FIG. 2 is a sectional view schematically illustrating a first form of the thin-film electroluminescent device according to the second aspect of the present invention.

FIG. 2 illustrates a first form of the thin-film electroluminescent device according to the second aspect of the present invention.

This thin-film electroluminescent device 10 has an electron injecting/transporting layer 4 interposed between the negative electrode 1 and the electroluminescent layer 3 of the thin-film electroluminescent device 10 as illustrated in FIG. 1. The electron injecting/transporting layer 4 functions to increase the efficiency of electron injection from the negative electrode 1 in the electroluminescent device layer 3.

In the thin-film electroluminescent device 10 illustrated in FIG. 2, at least one of the electroluminescent layer 3 and the electron injecting/transporting layer 4 is composed of a thin film of the above polyoxadiazole derivative represented by the formula (I).

In the thin-film electroluminescent device 10 illustrated in FIG. 2, if one of the electroluminescent layer 3 and the electron injecting/transporting layer 4 is composed of a thin film of the polyoxadiazole derivative represented by the formula (I), the other may be composed of the conventional material. However, it is preferred that both of the electroluminescent layer 3 and the electron injecting/transporting layer 4 be composed of thin films of the polyoxadiazole derivative represented by the formula (I).

In the formation of both of the electroluminescent layer 3 and the electron injecting/transporting layer 4 from thin films of the polyoxadiazole derivative represented by the formula (I), the electroluminescent layer 3 and the electron injecting/transporting layer 4 are composed of a polyoxadiazole derivative exhibiting excellent electroluminescence and a polyoxadiazole derivative which is excellent in capability of electron injection and transport, respectively.

In particular, it is preferred that the electroluminescent layer 3 comprise polyoxadiazole derivatives represented by the formula:

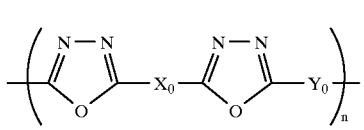

(I)

wherein $X_0$, $Y_0$ and n are as defined above, and that the electron injecting/transporting layer 4 comprise polyoxadiazole derivatives represented by the formula:

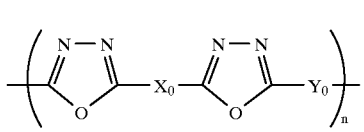

(II)

wherein $X_0$, $Y_0$ and n are as defined above.

The electroluminescent layer 3 and the electron injecting/transporting layer 4 are preferably composed of different materials. Therefore, at least one of $X_0$ and $Y_0$ of the formula (II) is preferably different from both of $X_0$ and $Y_0$ of the formula (I).

The type of the polyoxadiazole derivative comprising the electroluminescent layer 3 is selected in the same manner as in the electroluminescent layer 3 of the thin-film electroluminescent device 10 illustrated in FIG. 1.

The type of the polyoxadiazole derivative composing the electron injecting/transporting layer 4, i.e., the species of $X_0$ and $Y_0$ of the formula (II) are selected in the following manner.

In the formula (II), $X_0$ and $Y_0$ are not particularly limited as long as these are divalent organic groups and either thereof has capability of electron injection and transport. However, it is preferred that both be divalent organic groups capable of electron injection and transport, or that the one be an electroluminescent divalent organic group while the other is a divalent organic group capable of electron injection and transport.

In the formulae (I) and (II), appropriate species of $X_0$ and $Y_0$ are selected depending on the type of the material composing the negative electrode 1 and/or the positive electrode 2, the wavelength (color) of light emitted from the electroluminescent layer 3, etc.

When the electron injecting/transporting layer 4 is composed of a thin film of the polyoxadiazole derivative represented by the formula (I), the thickness of the electron injecting/transporting layer 4 is generally in the range of from 50 to 2000 Å, preferably from 50 to 500 Å.

Figure 3:
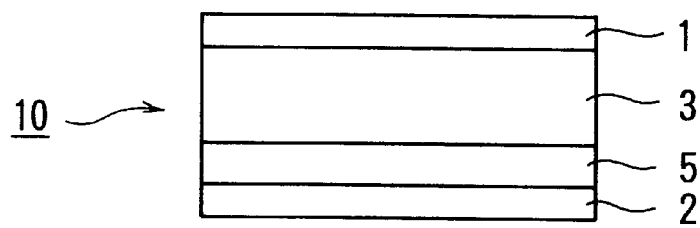
FIG. 3 is a sectional view schematically illustrating a second form of the thin-film electroluminescent device according to the second aspect of the present invention.

FIG. 3 illustrates a second form of the thin-film electroluminescent device according to the second aspect of the present invention.

This thin-film electroluminescent device 10 has a hole injecting/transporting layer 5 interposed between the positive electrode 2 and the electroluminescent layer 3 of the thin-film electroluminescent device 10 as illustrated in FIG. 1. The hole injecting/transporting layer 5 functions to increase the efficiency of hole injection from the positive electrode 2 in the electroluminescent layer 3.

In the thin-film electroluminescent device 10 illustrated in FIG. 3, at least one of the electroluminescent layer 3 and the hole injecting/transporting layer 5 is composed of a thin film of the above polyoxadiazole derivative represented by the formula (I).

In the thin-film electroluminescent device 10 illustrated in FIG. 3, if one of the electroluminescent layer 3 and the hole injecting/transporting layer 5 is composed of a thin film of the polyoxadiazole derivative represented by the formula (I), the other may be composed of the conventional material. However, it is preferred that both of the electroluminescent layer 3 and the hole injecting/transporting layer 5 be composed of thin films of the polyoxadiazole derivative represented by the formula (I).

In the formation of both of the electroluminescent layer 3 and the hole injecting/transporting layer 5 from thin films of the polyoxadiazole derivative represented by the formula (I), the electroluminescent layer 3 and the hole injecting/transporting layer 5 are composed of a polyoxadiazole derivative exhibiting excellent electroluminescence and a polyoxadiazole derivative which is excellent in capability of hole injection and transport, respectively.

In particular, it is preferred that the electroluminescent layer 3 comprise polyoxadiazole derivatives represented by the formula:

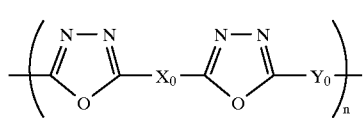

(I)

wherein $X_0$, $Y_0$ and n are as defined above, and that the hole injecting/transporting layer 5 comprise polyoxadiazole derivatives represented by the formula:

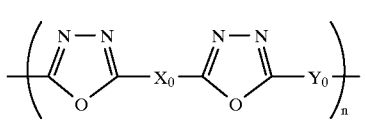

(II')

wherein $X_0$, $Y_0$ and n are as defined above.

The electroluminescent layer 3 and the hole injecting/transporting layer 5 are preferably composed of different materials. Therefore, at least one of $X_0$ and $Y_0$ of the formula (II') is preferably different from both of $X_0$ and $Y_0$ of the formula (I).

The type of the polyoxadiazole derivative comprising the electroluminescent layer 3 is selected in the same manner as in the electroluminescent layer 3 of the thin-film electroluminescent device 10 illustrated in FIG. 1.

The type of the polyoxadiazole derivative composing the hole injecting/transporting layer 5, i.e., the species of $X_0$ and $Y_0$ of the formula (II') are selected in the following manner.

In the formula (II'), $X_0$ and $Y_0$ are not particularly limited as long as these are divalent organic groups and either thereof has capability of hole injection and transport. However, it is preferred that both be divalent organic groups capable of hole injection and transport, or that the one be an electroluminescent divalent organic group while the other is a divalent organic group capable of hole injection and transport.

In the formulae (I) and (II'), appropriate species of $X_0$ and $Y_0$ are selected depending on the type of the material composing the negative electrode 1 and/or the positive electrode 2, the wavelength (color) of light emitted from the electroluminescent layer 3, etc.

When the hole injecting/transporting layer 5 is composed of a thin film of the polyoxadiazole derivative represented by the formula (I), the thickness of the hole injecting/transporting layer 5 is generally in the range of from 50 to 2000 Å, preferably from 50 to 500 Å.

Figure 4:
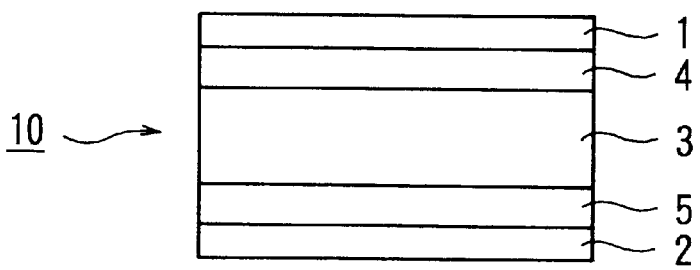
FIG. 4 is a sectional view schematically illustrating a third form of the thin-film electroluminescent device according to the second aspect of the present invention.

FIG. 4 illustrates a third form of the thin-film electroluminescent device according to the second aspect of the present invention.

This thin-film electroluminescent device 10 has an electron injecting/transporting layer 4 interposed between the negative electrode 1 and the electroluminescent layer 3 of the thin-film electroluminescent device 10 and further a hole injecting/transporting layer 5 interposed between the positive electrode 2 and the electroluminescent layer 3 of the thin-film electroluminescent device 10 as illustrated in FIG. 1. In the thin-film electroluminescent device 10 illustrated in FIG. 4, at least one, preferably all, of the electroluminescent layer 3, the electron injecting/transporting layer 4 and the hole injecting/transporting layer 5 are composed of thin films of the above polyoxadiazole derivative represented by the formula (I).

In the formation of all of the electroluminescent layer 3, the electron injecting/transporting layer 4 and the hole injecting/transporting layer 5 from thin films of the polyoxadiazole derivative represented by the formula (I), different polyoxadiazole derivatives are preferably used for the layers. That is, it is preferred that the electroluminescent layer 3, the electron injecting/transporting layer 4 and the hole injecting/transporting layer 5 be composed of a polyoxadiazole derivative exhibiting excellent electroluminescence, a polyoxadiazole derivative which is excellent in capability of electron injection and transport and a polyoxadiazole derivative which is excellent in capability of hole injection and transport, respectively. In this respect, further illustration will be made. With respect to the above polyoxadiazole derivatives, suitable species are selected depending on the type of the material composing the negative electrode 1 and/or the positive electrode 2, the wavelength (color) of light emitted from the electroluminescent layer 3, etc.

With respect to the polyoxadiazole derivatives for composing the electroluminescent layer 3 of the thin-film electroluminescent device 10 illustrated in FIG. 4, suitable species are selected as with respect to the polyoxadiazole derivatives for composing the electroluminescent layer 3 of the thin-film electroluminescent device 10 illustrated in FIG. 1. Further, with respect to the polyoxadiazole derivatives for composing the electron injecting/transporting layer 4, suitable species are selected as with respect to the polyoxadiazole derivatives for composing the electron injecting/transporting layer 4 of the thin-film electroluminescent device 10 illustrated in FIG. 2. Still further, with respect to the polyoxadiazole derivatives for composing the hole injecting/transporting layer 5, suitable species are selected as with respect to the polyoxadiazole layer 5 of the thin-film electroluminescent device 10 illustrated in FIG. 3.

All the thin-film electroluminescent devices 10 illustrated in FIGS. 1 to 4 individually have the electroluminescent layer 3 between the electrodes 1 and 2. In any of the thin-film electroluminescent devices 10, at least one of the negative electrode 1 and the positive electrode 2 is transparent. When a voltage is applied between the electrodes 1,2, the electroluminescent layer 3 emits light, which is transmitted through the transparent electrode 1 and/or electrode 2.

In the thin-film electroluminescent devices illustrated in FIGS. 1 to 4, a thin film of the polyoxadiazole derivative represented by the formula (I), formed according to the vapor deposition polymerization process is disposed as the electroluminescent layer 3 between the electrodes 1, 2, at least one of which is transparent, and the thin film is disposed as the electron injecting/transporting layer 4 or the hole injecting/transporting layer 5 between the electrode 1 or 2 and the electroluminescent layer 3.

That is, in the present invention, at least one of the electroluminescent layer 3, the electron injecting/transporting layer 4 and the hole injecting/transporting layer 5 is composed of a thin film of the polyoxadiazole derivative represented by the formula (I).

The polyoxadiazole derivative composing this thin film contains oxadiazole rings, which themselves have electroluminescent properties. Therefore, $X_0$ and $Y_0$ of the formula (I) are not limited as long as these are divalent organic groups.

However, if at least one of $X_0$ and $Y_0$ has capability of electroluminescence and/or capability of charge injection and transport (at least one of capability of electron injection and transport and capability of hole injection and transport) the thin-film electroluminescent device 10 can have improved electroluminescence efficiency. From this viewpoint, it is preferred that at least one of the above $X_0$ and $Y_0$ have capability of electroluminescence and/or capability of charge injection and transport.

For example, when the electron injecting/transporting layer 4 is composed of the polyoxadiazole derivative represented by the formula (I), it is preferred that at least one of $X_0$ and $Y_0$ of the formula (I) be selected from the following divalent organic groups.

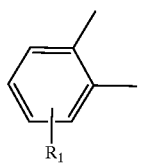

(E-1)

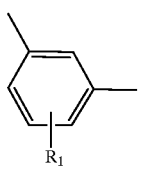

(E-2)

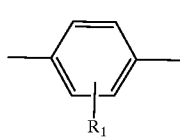

(E-3)

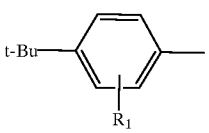

(E-4)

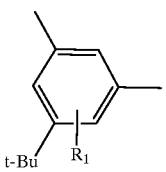

(E-5)

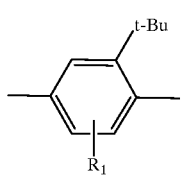

(E-6)

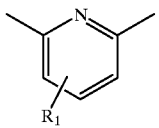

(E-7)

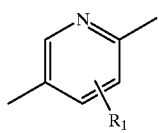

(E-8)

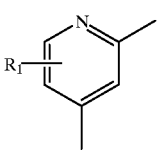

(E-9)

(E-10) 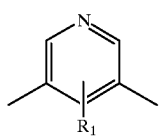
(E-11) 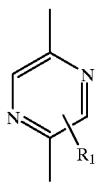
(E-12) 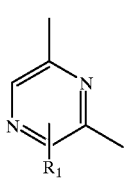
(E-13) 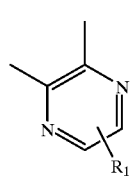
(E-14) 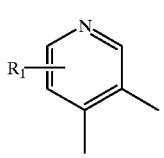
(E-15) 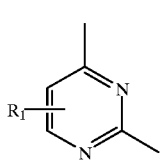
(E-16) 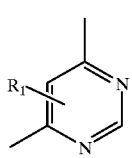
(E-17) 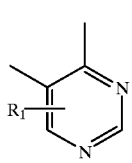
(E-18) 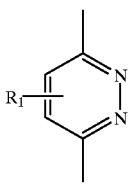
(E-19) 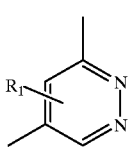
(E-20) 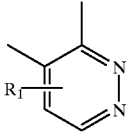
(E-21) 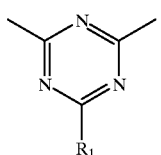
(E-22) 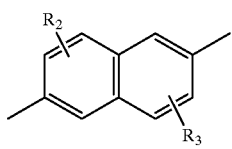
(E-23) 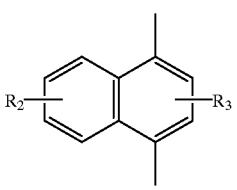
(E-24) 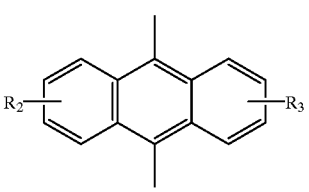
(E-25) 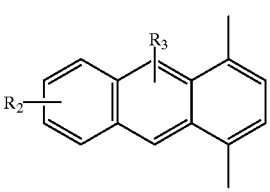

(E-26)
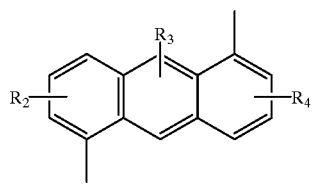
(E-27)
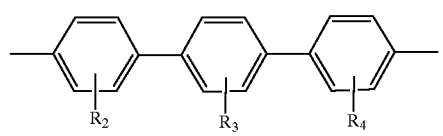
(E-28)
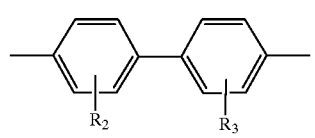
(E-29)
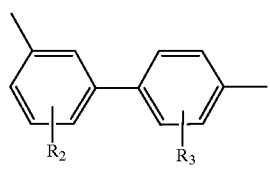
(E-30)
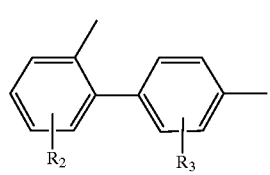
(E-31)
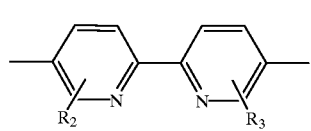
(E-32)
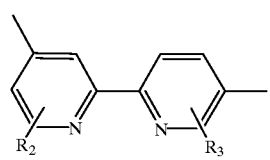
(E-33)
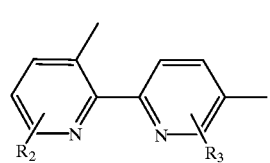
(E-34)
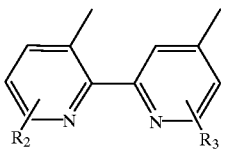
(E-35)
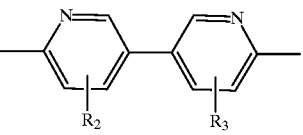
(E-36)
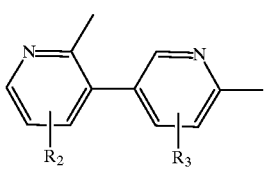
(E-37)
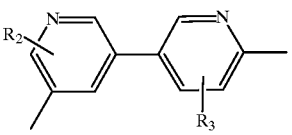
(E-38)
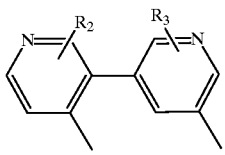
(E-39)
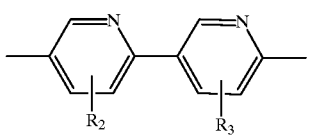
(E-40)
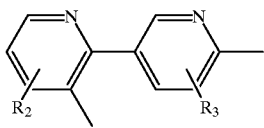
(E-41)
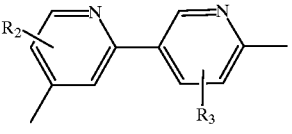
(E-42)
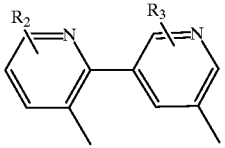

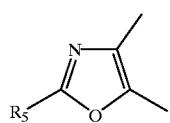 (E-43)
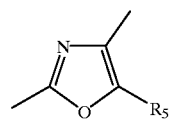 (E-44)
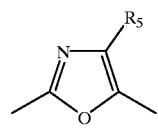 (E-45)
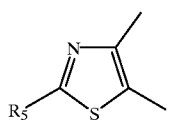 (E-46)
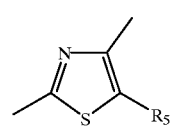 (E-47)
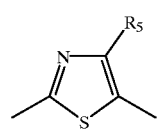 (E-48)
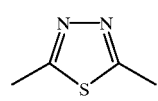 (E-49)
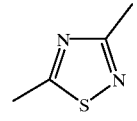 (E-50)
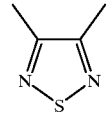 (E-51)
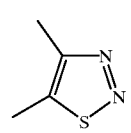 (E-52)
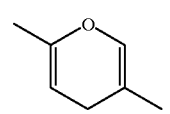 (E-53)
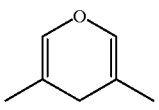 (E-54)
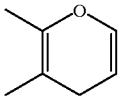 (E-55)
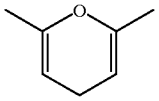 (E-56)
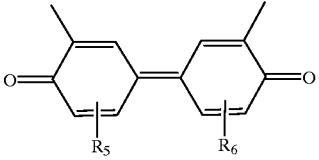 (E-57)
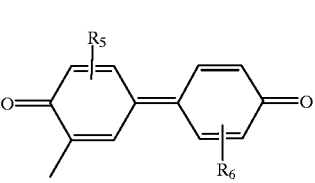 (E-58)
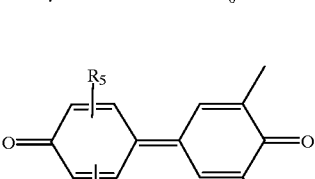 (E-59)
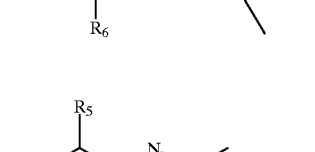 (E-60)
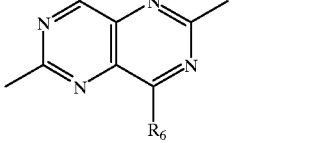 (E-61)

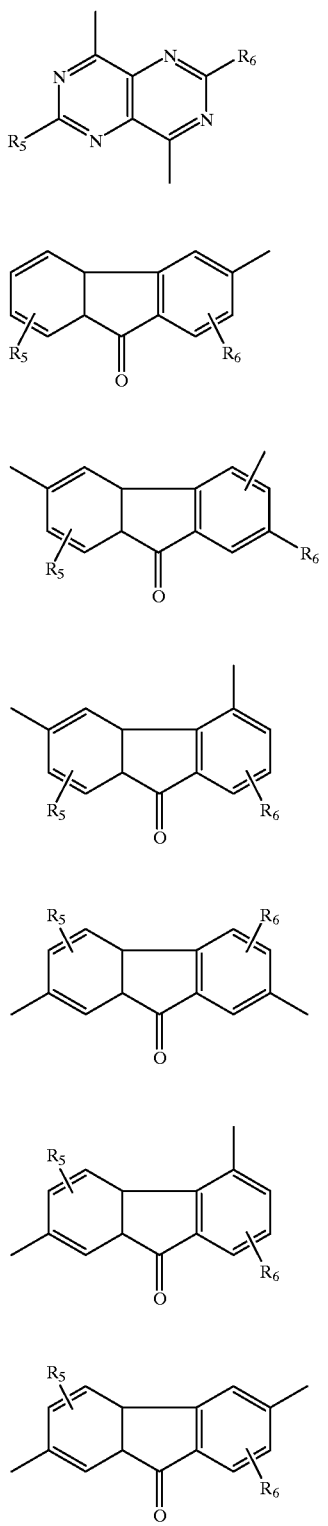

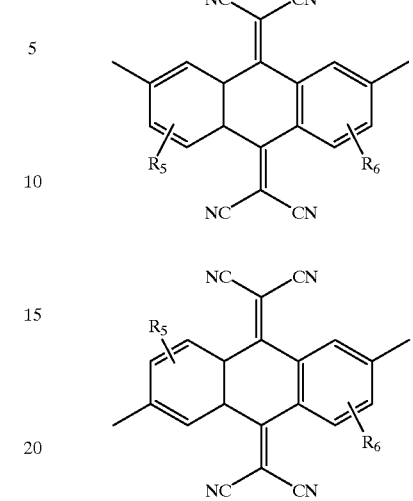

The above groups may be mutually bonded directly or through a divalent bonding group, such as —CH$_2$—, —SiH$_2$—, —O— or —S—. Of these divalent bonding groups, the hydrogen atoms of —CH$_2$— and —SiH$_2$— may each be substituted with an alkyl or aryl group.

Each of the above R$_1$ to R$_6$ independently is a group selected from the group consisting of hydrogen and halogen atoms and cyano, alkyl, aralkyl and alkyloxy groups.

Of the above groups, preferred divalent organic groups being excellent in capability of charge injection and transport include groups (E-1) to (E-3), (E-5), (E-7), (E-8), (E-11), (E-21), (E-31), (E-34), (E-35), (E-56), (E-58), (E-60) and (E-70), and especially m-phenylene, p-phenylene, 4,4'-biphenyldiyl and 2,6-pyridinediyl groups. Among them, p-Phenylene group is especially preferred.

The electron injecting and transporting layer 4 composed of the polyoxadiazole derivative represented by the formula (I) may comprise electron injecting/transporting additives such as diphenoquinone and fluorenone derivatives disclosed in Chem. Mater., Vol. 3 (1991) pp. 709–714 and J. Imag. Sci., Vol. 29, No. 2 (1985) pp. 69–72, in an amount of generally from 0.01 to 80% by mole, preferably from 1 to 60% by mole per repeating unit of the polyoxadiazole derivative represented by the formula (I).

When the hole injecting/transporting layer 5 is composed of the polyoxadiazole derivative represented by the formula (I), each of X$_0$ and Y$_0$ of the formula (I) independently is a divalent organic group. At least one of X$_0$ and Y$_0$ of the formula (I) is a group derived from the following compounds:

tertiary aromatic amine and porphyrin compounds disclosed in Japanese Patent Laid-Open Publication No. 295695/1988, and tertiary aromatic amine compounds disclosed in Japanese Patent Laid-Open Publication Nos. 27033/1978, 58445/1979, 149634/1979, 64299/1979, 144250/1980, 119132/1981, 295558/1986 and 98303/1986.

Examples of groups suitable for use in the hole injecting/transporting layer 5 are as follows:

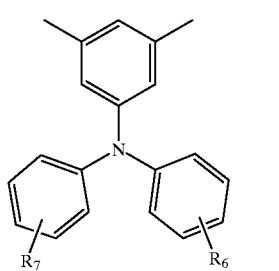
(H-1)
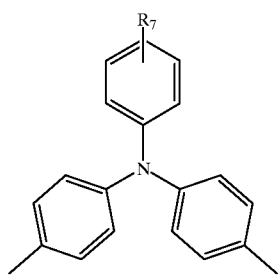
(H-2)
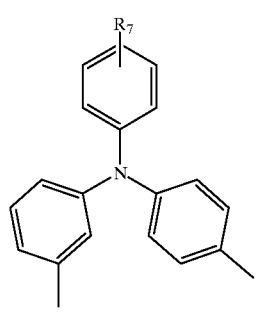
(H-3)
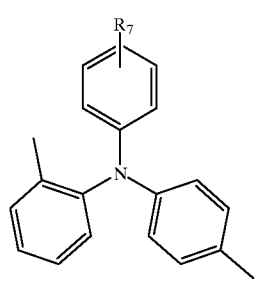
(H-4)
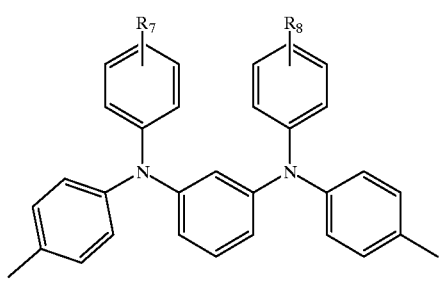
(H-5)
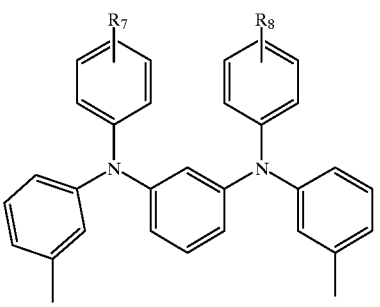
(H-6)
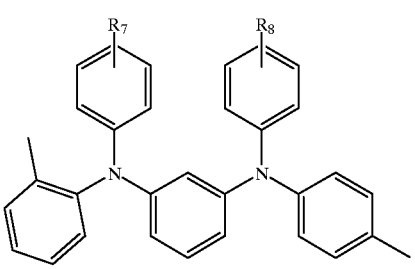
(H-7)
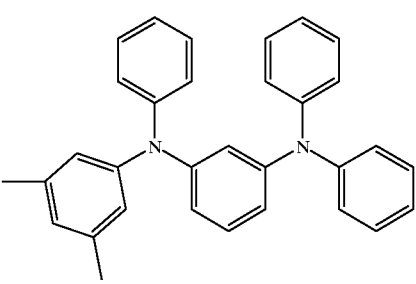
(H-8)
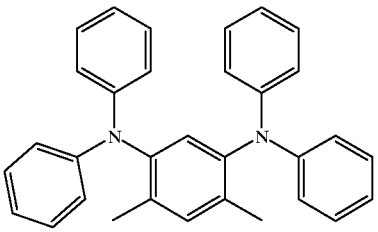
(H-9)
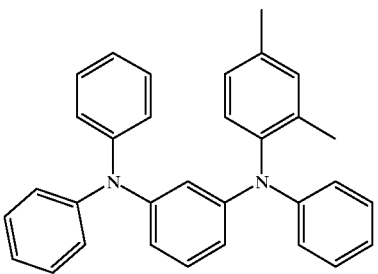
(H-10)

(H-11)
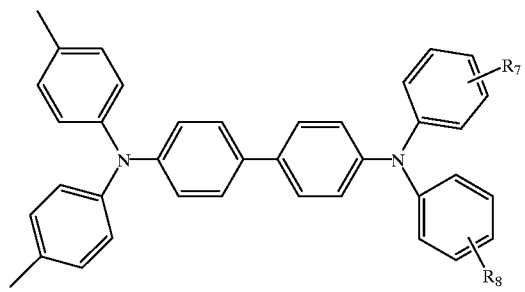
(H-12)
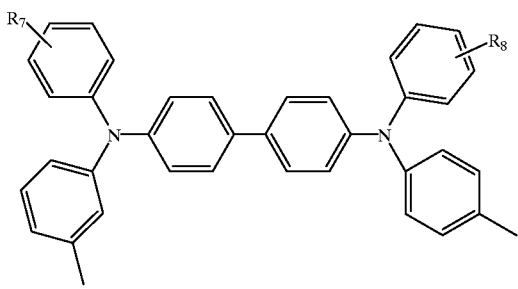
(H-13)
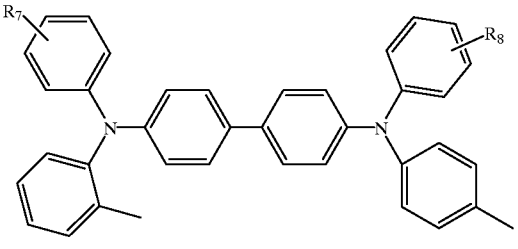
(H-14)
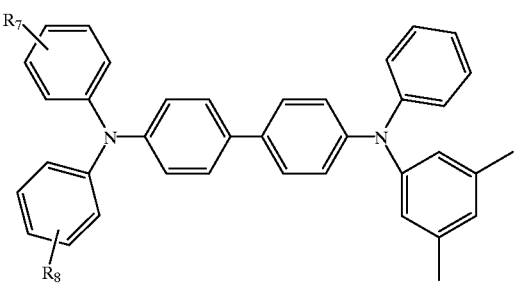
(H-15)
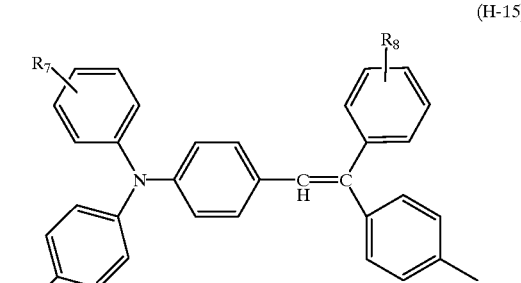
(H-16)
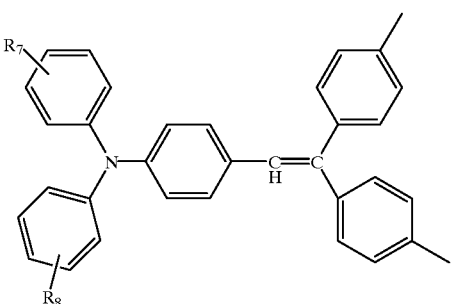
(H-17)
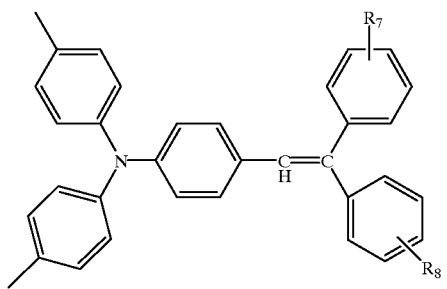
(H-18)
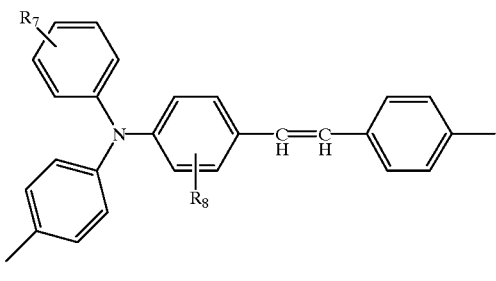
(H-19)
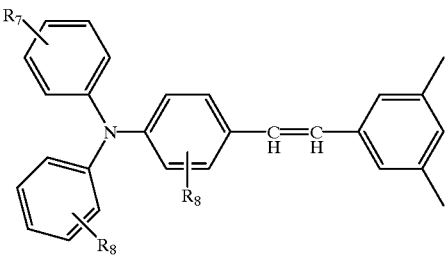
(H-20)
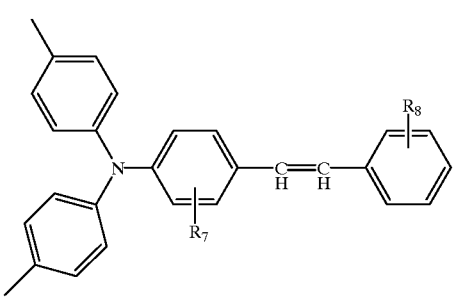

(H-21)
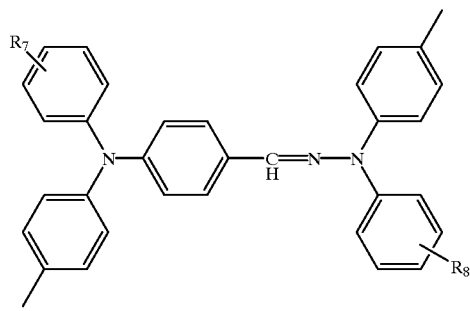

(H-22)
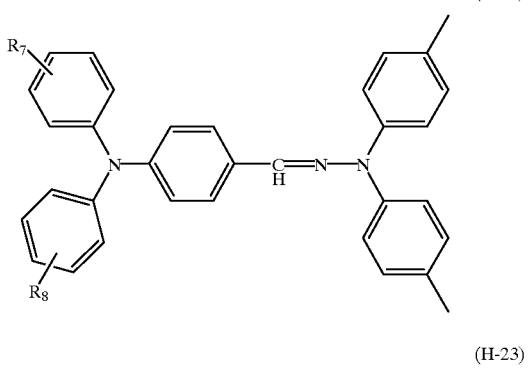

(H-23)
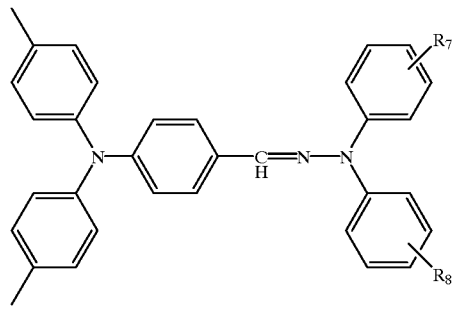

(H-24)
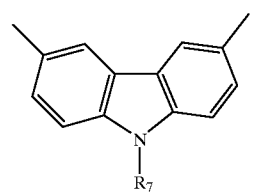

(H-25)
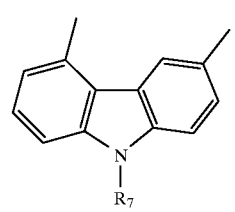

(H-26)
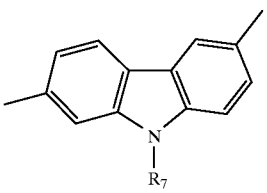

(H-27)
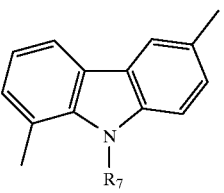

The above groups may be mutually bonded directly or through a divalent bonding group, such as —$CH_2$—, —$SiH_2$—, —O— or —S—. Of these divalent bonding groups, the hydrogen atoms of —$CH_2$— and —$SiH_2$— may each be substituted with an alkyl or aryl group.

Each of the above $R_7$ and $R_8$ independently is a group selected from the group consisting of hydrogen and halogen atoms and cyano, alkyl, aralkyl and alkyloxy groups.

Of the above groups, preferred divalent organic groups being excellent in capability of charge injection and transport include groups (H-1), (H-2), (H-5), (H-6), (H-14), (H-16), (H-19), (H-22) and (H-24).

The hole injecting/transporting layer 5 composed of the polyoxadiazole derivative represented by the formula (I) may optionally comprise a hole injecting/transporting additive such as 4,4',4"-tris(N,N-diphenylamino)triphenylamine, 4,4',4"-tris[N-(3-methylphenyl)-N-phenylamino]triphenylamine and other triphenylamine derivatives disclosed in Chem. Lett., 1989, p.1145, in an amount of generally from 0.01 to 80% by mole, preferably from 1 to 50% by mole per repeating unit of the polytoxadiazole derivative represented by the formula (I).

When at least one of the divalent organic groups represented by $X_0$ and $Y_0$ of the formula (I) is the divalent group capable of electron injection and transport or the divalent group capable of hole injection and transport, the thin film composed of the polyoxadiazole derivative represented by the formula (I) not only has the capability of charge injection and transport but also is itself capable of emitting fluorescence.

For example, when $X_0$ and $Y_0$ of the formula (I) represent a 1,4-phenylene group and a 1,3-phenylene group, respectively, the polymeric thin film composed of the polyoxadiazole derivative represented by the formula (I) emits blue fluorescence maximized at a wavelength of 410 nm. On the other hand, when both $X_0$ and $Y_0$ of the formula (I) represent 1,4-phenylene groups, the polymeric thin film composed of the polyoxadiazole derivative represented by the formula (I) emits blue fluorescence maximized at a wavelength of 450 nm.

Thus, the polymeric thin film composed of the polyoxadiazole derivative represented by the formula (I) can cause the thin-film electroluminescent device 10 to emit fluorescence having a wave length of 400 to 600 nm, depending on combinations of $X_0$ and $Y_0$ of the formula (I).

Further, when at least one of the divalent organic groups represented by $X_0$ and $Y_0$ of the formula (I) is selected from the following divalent groups which has electroluminescent properties, the electroluminescent device efficiency of the polyoxadiazole derivative represented by the formula (I) is remarkably improved.

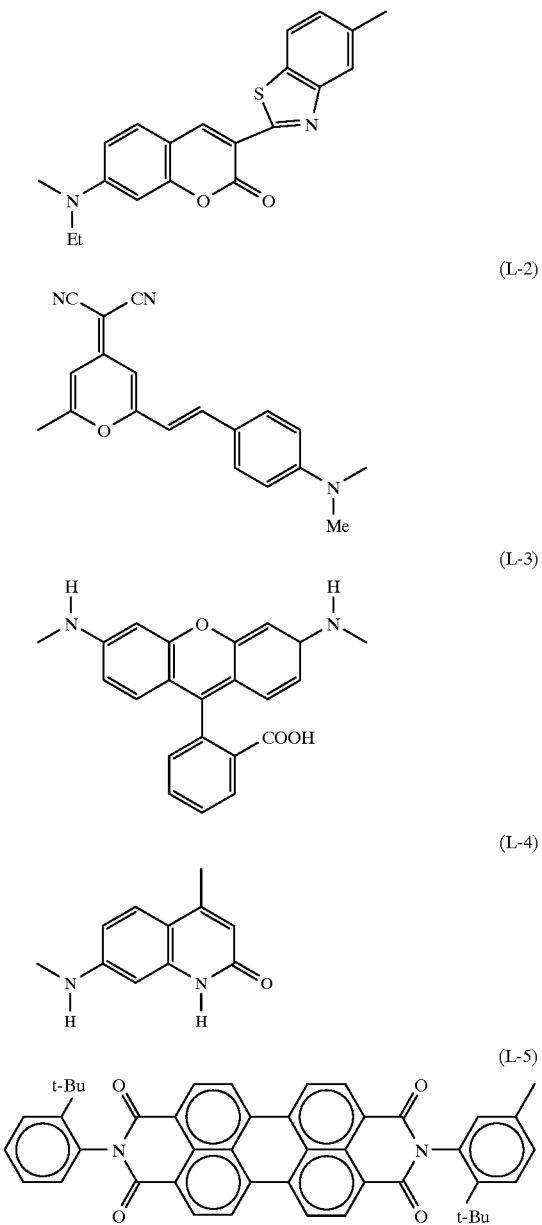

Among these groups, the group (L-1) is especially preferred.

The electroluminescent layer 3 composed of the polyoxadiazole derivative represented by the formula (I) may optionally comprise a fluorescent dye or pigment such as coumarin 343, NK 757, DCM and NK 2929 and an aluminum quinolinol complex known as laser dyes, in an amount of generally from 0.01 to 10% by mole, preferably from 0.01 to 5% by mole per repeating unit of the polytoxadiazole derivative represented by the formula (I).

When a voltage is applied between the electrodes 1, 2 of the thin-film electroluminescent device 10 having the electroluminescent layer 3 comprising the polyoxadiazole derivative represented by the formula (I) and the above fluorescent dye or pigment, the thin-film electroluminescent device 10 emits fluorescence characteristic of the fluorescent dye or pigment. For example, when coumarin 343, an aluminum quinolinol complex, Nk757 and DCM are individually used as a fluorescent dye, the electroluminescent device 10 emits bluish-green, green, yellow and red fluorescence, respectively. Thus, according to the present invention, the color of light emitted by the electroluminescent device 10 can be controlled depending on the type of the fluorescent dye or pigment by causing the electroluminescent layer 3 composed of the polyoxadiazole derivative represented by the formula (I) to contain the fluorescent dye or pigment.

In the molecule of the polyoxadiazole derivative represented by the formula (I), the oxadiazole rings are bonded alternatively with $X_0$s and $Y_0$s. When both of $X_0$ and $Y_0$ are the π-electron conjugated groups, it is expected that the continuous conjugation of π-electrons can be provided along the principal chain of the molecule thereby to be excellent in electron-conductivity. Therefore, both of $X_0$ and $Y_0$ are preferable to be π-electron conjugated groups.

In the polyoxadiazole derivative represented by the formula (I), a carbonyl group being a trap of a carrier (electron or hole) as in the polyimide represented by the formula (IX) does not form part of the principal chain of the polyoxadiazole. Therefore, the thin film composed of the polyoxadiazole derivative represented by the formula (I) is expected to be excellent in electron conductivity as compared with the conventional thin film composed of the polyimide represented by the formula (IX).

In the present invention, preferably at least one, still preferably both of the electron injecting/transporting layer 4 and the hole injecting/transporting layer 5 are silicon-atom containing polymeric compounds.

In particular, when the electrode 1 or 2 is provided in the form of a thin film on a glass plate, or when the electrode 1 or 2 is a metal electrode, the formation of the above charge injecting/transporting layer 4 or 5 comprising a silicon-atom containing polymeric compound between the electrode 1 or 2 and the electroluminescent layer 3 improves the adhesion between the electrode 1 or 2 and the electroluminescent layer 3.

The silicon-atom containing polymeric compound for use in the charge injecting/transporting layer 4 or 5 preferably has capability of charge injection and transport.

Especially, in particular, the electroluminescent layer 3 of each of the thin-film electroluminescent devices 10 illustrated in FIGS. 2 to 4 is composed of a thin film of the polyoxadiazole derivative represented by the formula (I), it is preferred that at least one of charge injecting/transporting layers 4 and 5 be composed of a silicon-atom containing polyoxadiazole represented by the formula:

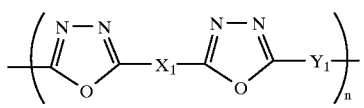

(III)

wherein each of $X_1$ and $Y_1$ independently represents a divalent organic group and at least one of which has a silicon atom, and n is an integer of 2 or greater.

The divalent organic groups having a silicon atom include divalent organic groups formed by mutual bonding through a silicon-atom containing divalent bonding group, such as —SiH$_2$—, of divalent organic groups capable of electron or hole injection and transport mentioned above as examples of the divalent organic groups comprising a silicon atom, for example,

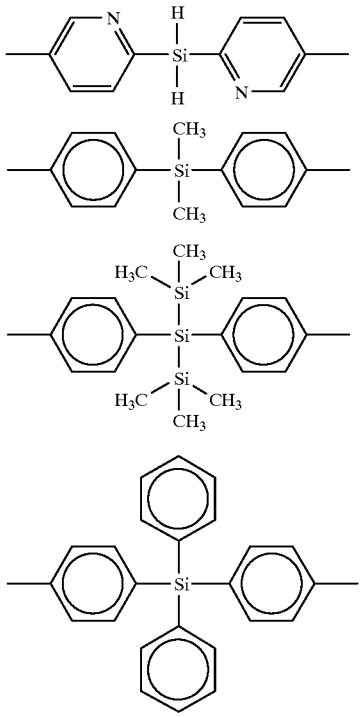

When the thin film of the silicon-atom containing polyoxadiazole represented by the formula (III) is formed according to the vapor deposition polymerization process, the thin film constitutes part of the thin film of the polyoxadiazole derivative represented by the formula (I).

Thus, when the thin film of the silicon-atom containing polyoxadiazole represented by the formula (III) is formed according to the vapor deposition polymerization process as the charge injecting/transporting layer (electron injecting/transporting layer 4 and/or hole injecting/transporting layer 5) of each of the thin-film electroluminescent devices 10 illustrated in FIGS. 2 to 4, the electroluminescent layer 3 may be composed of the conventional electroluminescent material.

Figure 5:
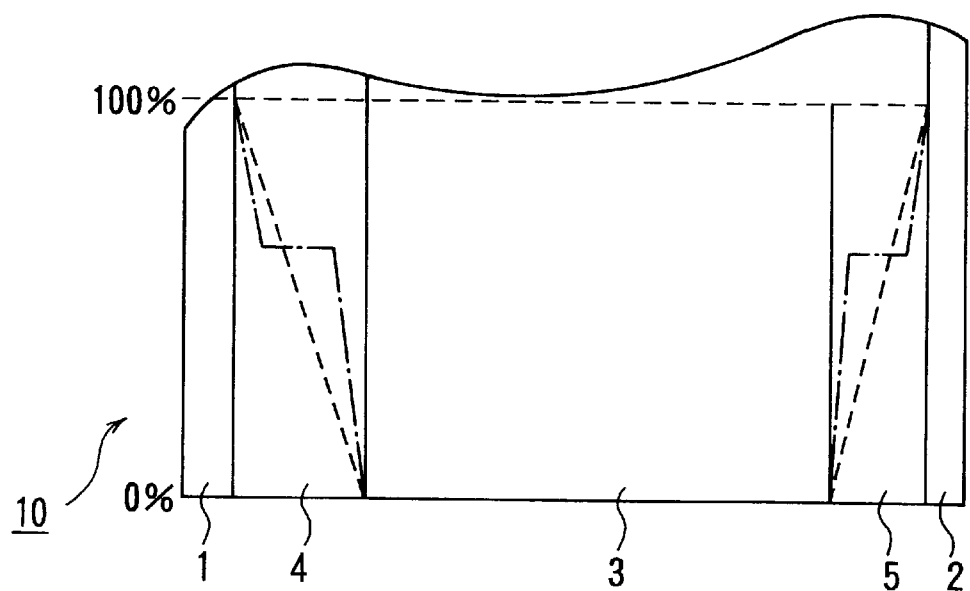
FIG. 5 is a partial sectional view schematically illustrating the formation of the charge injecting/transporting layer comprising a silicon-atom containing polymeric compound and a polycondensed polymeric compound containing no silicon atom.

Preferably, the charge injecting/transporting layer (electron injecting/transporting layer 4 and/or hole injecting/transporting layer 5) composed of the silicon-atom containing polymeric compound further comprises a polycondensed polymeric compound containing no silicon atom, in which the content of the silicon-atom containing polymeric compound decreases from the electrode 1 or 2 toward the electroluminescent layer 3 continuously as shown by a broken line in FIG. 5 or stepwise as shown by a dot-dashed line in FIG. 5 while the content of the polycondensed polymeric compound containing no silicon atom increases from the electrode toward the electroluminescent layer continuously as shown by a broken line in FIG. 5 or stepwise as shown by a dot-dashed line in FIG. 5.

The polycondensed polymeric compound containing no silicon atom preferably has capability of charge injection and transport.

The polycondensed polymeric compound containing no silicon atom, suitable for use in the present invention, includes, for example, polymeric compounds such as polyimides, polyamides, polyamide-imides, polyureas and polyazomethines (see Polymer Preprints Japan, Vol. 136, p1475 and p3021 (1987)) and polymeric compounds each having a polyoxadiazole structure, represented by the formula:

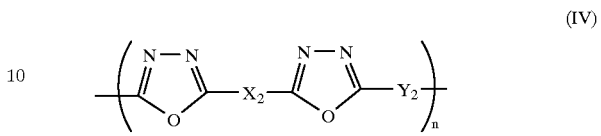

wherein each of X$_2$ and Y$_2$ independently represents a divalent organic group which does not have a silicon atom, and n is an integer of 2 or greater.

The X$_2$s and Y$_2$s of the formula (IV) include divalent organic groups capable of electron or hole injection and transport mentioned above as examples of X$_0$s and Y$_0$s contained in the polyoxadiazole derivative represented by the formula (I) and divalent organic groups formed by mutual bonding thereof through a divalent bonding group containing no silicon atom, such as —CH$_2$—, —O— and —S—. Of these divalent bonding groups, the hydrogen atoms of —CH$_2$— may each be substituted by an alkyl or aryl group.

In particular, when the silicon-atom containing polymeric compound is the silicon-atom ontaining polyoxadiazole represented by the formula (III), it is preferred that the polycondensed polymeric compound containing no silicon atom be the polyoxadiazole represented by the formula (IV).

When both the silicon-atom containing polyoxadiazole represented by the formula (III) and the polyoxadiazole containing no silicon atom, represented by the formula (IV) are produced by the vapor deposition polymerization process, the thus formed thin polyoxadiazole film constitutes part of the thin film of the polyoxadiazole derivative represented by the formula (I).

Thus, when the charge injecting/transporting layer (electron injecting/transporting layer 4 and/or hole injecting/transporting layer 5) of each of the thin-film electroluminescent devices 10 illustrated in FIGS. 2 to 4 is composed of the above thin polyoxadiazole film, the electroluminescent layer 3 may be composed of the conventional electroluminescent material. It is preferred, however, that the electroluminescent layer 3 be the same as the thin film of the polyoxadiazole containing no silicon atom, represented by the formula (IV).

When the polyoxadiazole containing no silicon atom, included in the charge injecting/transporting layer is the same as the polyoxadiazole composing the electroluminescent layer 3, the charge injecting/transporting layer is continuously unified with the electroluminescent layer 3 to thereby create resistance to the peeling between the charge injecting/transporting layer and the electroluminescent layer 3.

In each of the thin-film electroluminescent devices 10 illustrated in FIGS. 1 to 4, a protective film, such as an antioxidant film, may be provided either so as to cover the surfaces of the negative electrode 1 and the positive electrode 2 or so as to seal the whole body of the device 10. The protective film provided on the negative electrode 1 and the positive electrode 2 increases the stability thereof, thereby improving the practicability and durability of the thin-film electroluminescent device 10. The protective film may be composed of a metal exhibiting a high work function, amorphous silica, germanium monoxide, silicon monoxide, an epoxy resin, a silicone resin or a fluorinated resin.

The above-mentioned thin-film electroluminescent device of the present invention can be produced after going through the steps of:

i) forming an electrode 1 or 2 on a plate;

ii) optionally forming a first charge injecting/transporting layer 4 or 5 on the electrode 1 or 2 according to the vapor deposition polymerization process;

iii) forming an electroluminescent layer 3 on either the electrode 1 or 2 or the first charge injecting/transporting layer 4 or 5 according to the vapor deposition polymerization process;

iv) optionally forming a second charge injecting/transporting layer 4 or 5 (for example, the second charge injecting/transporting layer is a hole injecting/transporting layer 5 when the first charge injecting/transporting layer is an electron injecting/transporting layer 4) capable of injection and transport of charges opposite to those injected in and transported by the first charge injecting/transporting layer 4 or 5 on the electroluminescent layer 3 according to the vapor deposition polymerization process;

v) forming a counter electrode 1 or 2 (when the formed (for example, in step i) electrode is a negative electrode 1, the counter electrode is a positive electrode 2) on either the electroluminescente layer 3 or the second charge injecting/transporting layer 4 or 5; and vi) optionally providing a sealing layer for electroluminescent device on the counter electrode.

In the present invention, the electroluminescent layer 3 and/or the charge injecting/transporting layer (electron injecting/transporting layer 4 and/or hole injecting/transporting layer 5) is composed of a thin film of the polyoxadiazole derivative represented by the formula (I), which is produced by the vapor deposition polymerization process.

In the present invention, in the formation of the thin film of the polyoxadiazole derivative represented by the formula (I) according to the vapor deposition polymerization process, use is made of, as monomers for condensation polymerization, a dicarboxylic acid represented by the formula:

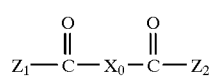

(V)

wherein $X_0$ represents a divalent organic group which may comprise a silicon atom, and each of $Z_1$ and $Z_2$ independently represents a halogen atom or an organic group represented by the formula JK— in which J represents a monovalent organic group having an organic ring structure and K represents an atom selected from nitrogen, oxygen and sulfur atoms, provided that when K is a nitrogen atom, the nitrogen atom may constitute part of the organic ring structure of J, and a dihydrazide compound represented by the formula:

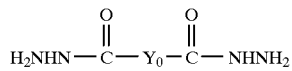

(VI)

wherein $Y_0$ represents a divalent organic group which may comprise a silicon atom. $X_0$ of the formula (V) and $Y_0$ of the formula (VI) represent the same groups as represented by $X_0$s and $Y_0$s of the formula (I), and specific species thereof are selected in the same manner as for those of $X_0$s and $Y_0$s of the formula (I).

$Z_1$ and $Z_2$ of the formula (V) may represent halogen atoms, such as chlorine. However, if the electroluminescent layer 3 and/or the charge injecting/transporting layer (electron injecting/transporting layer 3 and/or hole injecting/transporting layer 5) is composed of the thin film of the polyoxadiazole derivative formed by the vapor deposition polymerization of the dicarboxylic acid derivative of the formula (V) in which at least one of $Z_1$ and $Z_2$ is a halogen atom and the dicarbodihydrazide compound of the formula (VI), the halogen atom positioned at the terminal of the dicarboxylic acid derivative reacts with the —NH$_2$ group at the terminal of the dihydrazide compound to thereby incidentally produce a hydrogen halide which is a strong acid. This hydrogen halide is possible to corrode the electrode 1 and/or 2 in any of the thin-film electroluminescent devices 10 illustrated in FIGS. 1 to 4 or possible to corrode the frame of the apparatus for vapor deposition used in the vapor deposition polymerization itself even if the electrode 1 and/or 2 is not corroded.

When there is possibility of such occurrences as mentioned above, it is preferred that both of $Z_1$ and $Z_2$ of the formula (V) be organic groups represented by the formula JK—.

When the electroluminescent layer 3 and/or the charge injecting/transporting layer is composed of the thin film of the polyoxadiazole derivative formed by the vapor deposition polymerization of the dicarboxylic acid derivative of the formula (V) in which both of $Z_1$ and $Z_2$ of the formula (V) be organic groups represented by the formula JK— and the dicarbodihydrazide compound of the formula (VI), the by-products formed by the polymerization of the above monomers are organic compounds represented by the formula JKH, which are not strong acids as opposed to the above hydrogen halide. Therefore, there is no apprehension of the corrosion of the electrode 1 and/or 2 in any of the thin-film electroluminescent devices 10 illustrated in FIGS. 1 to 4 and further of the corrosion of the apparatus for vapor deposition used in the vapor deposition polymerization.

Especially preferred groups represented by the $Z_1$ and $Z_2$ of the formula (V) are as follows:

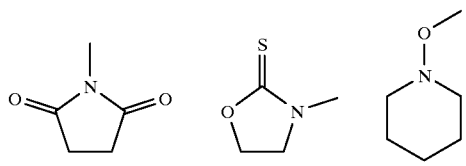

-continued

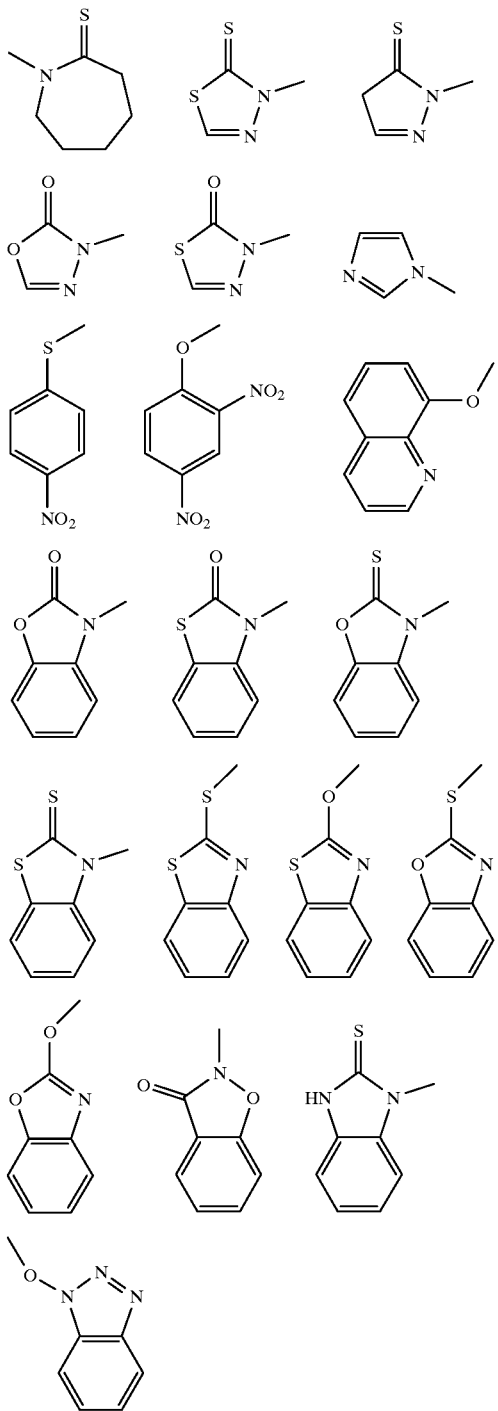

For example, when $Z_1$ and $Z_2$ of the formula (V) represent groups selected from the group consisting of 2-benzoxazoylthio, 2-benzothiazoylthio, 2-benzothiazolyloxy, 2-benzisoxazoyloxy, 1-benzotriazoyloxy and 2,4-dinitrophenoxy groups, these groups react with the terminal group —$NH_2$ of the formula (II) in the vapor deposition polymerization to thereby form corresponding by-products, i.e., 2-mercaptobenzoxazole, 2-mercaptobenzothiazole, 2-hydroxybenzothiazole, 2-hydroxyisobenzoxazole, 1-hydroxybenzotriazole and 2,4-dinitrophenol. These by-products do not corrode the electrode of the organic electroluminescent device or the apparatus for vapor deposition as opposed to the hydrogen halide occurring in the vapor deposition polymerization of an acid halide and a dihydrazide.

In the present invention, the thin film of the polyoxadiazole derivative represented by the formula (I) is produced by the following sequence of steps.

Figure 6:
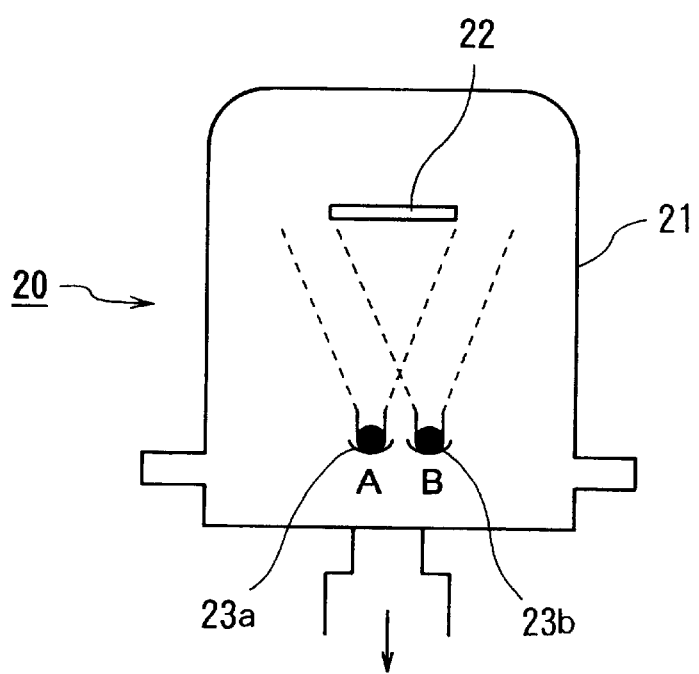
FIG. 6 shows a view for explaining a vapor deposition polymerization apparatus.

(a) First, a plate 22 to be coated, for example, a plate with an electrode of, for example, ITO is disposed in a vapor deposition chamber 21 of a vapor deposition apparatus 20 as shown in FIG. 6 in an arrangement such that a vapor deposition film is formed on the ITO electrode (surface to be coated).

(b) The above two types of monomers A, B for condensation polymerization are put in separate vapor sources 23a, 23b in the vapor deposition apparatus 20.

(c) The inside of the vapor deposition chamber 21 is vacuated to a pressure of generally $10^{-2}$ Pa or lower, referably $10^{-3}$ Pa or lower.

(d) During the evacuation of the inside of the vapor deposition chamber 21 to the above pressure, the temperature of the surface to be coated, e.g., the ITO electrode side of the plate with the ITO electrode is adjusted to −50 to 200° C., preferably 20 to 100° C.

(e) When the pressure of the inside of the vapor deposition chamber 21 reaches the above predetermined value, the vapor sources 23a, 23b each having the monomers A, B for condensation polymerization placed therein are regulated to a temperature at which at an evaporation speed of not less than $10^{-10}$ mol/sec·cm$^2$, preferably not less than $10^{-8}$ mol/sec·cm$^2$ each of the monomers A, B is evaporated under the pressure. Such a temperature is generally in the range of from −10 to 500° C., preferably from 40 to 400° C., still preferably from 70 to 300° C., especially preferably from 100 to 250° C. If at least one of the monomers for condensation polymerization is evaporated at temperatures lower than room temperature, for example −10° C., under the predetermined pressure, the vapor source having the monomer placed therein or the place in which the vapor deposition apparatus is set is cooled to a temperature of, for example, lower than −10° C. prior to the heating of the vapor source in order to prevent the evaporation of the monomer before the predetermined pressure is reached.

The pressure inside the vapor deposition chamber and the heating temperature for evaporating the monomers for polymerization are generally regulated so as to achieve the evaporation of the dicarboxylic acid derivative of the formula (V) and the dihydrazide compound of the formula (VI) in a molar ratio of 1:1 to 1:30, preferably 1:1 to 1:20 and also the formation of a vapor deposition film at a rate of 0.1 to 10 Å/sec, preferably 1 to 4 Å/sec. Copolymerization proceeds on the coated surface.

(f) Thus, a vapor deposition film having a thickness of about 50 to 2000 Å is formed. This vapor deposition film is heated at 100 to 400° C., preferably 200 to 300° C. for 1 to 240 min, preferably 10 to 120 min in a vapor or an inactive gas. As a result, a polycarbohydrazide as a precursor from the monomers is converted to the polyoxadiazole derivative of the formation (I), and a thin film thereof is formed on the coated surface, such as the ITO electrode of the plate with the ITO electrode.

The polymerization degree of the thus obtained polyoxadiazole derivative corresponds to the value of n in the formula (I), and it is an integer of 2 or greater, preferably 10 or greater, still preferably 100 or greater.

The polycarbohydrazide as a precursor of the polyoxadiazole represented by the formula (I) is soluble in organic polar solvents, such as dimethylformamide (DMF), dimethylacetamide (DMA), dimethyl sulfoxide (DMSO), N-methylpyrrolidone and pyridine. By contrast, the polyoxadiazole represented by the formula (I) is sparingly soluble in concentrated sulfuric acid. Thus, conveniently, the polymerization degree of the polycarbohydrazide is measured by the use of the above organic solvent, and the polymerization degree n of the polyoxadiazole represented by the formula (I) is presumed therefrom.

When it is desired to incorporate additives, such as those capable of electron injection and transport, capable of hole injection and transport and capable of electroluminescence mentioned above, in the thin film of the polyoxadiazole represented by the formula (I), this can be accomplished by placing the additives in a vapor source separate from those for the carboxylic acid derivative represented by the formula (V) and the dihydrazide compound represented by the formula (VI) in the step (b) and then carrying out the steps (c) through (f) as described above.

The vapor deposition film formed in the above step (e) can precisely be controlled to thereby provide a stoichiometrically excellent thin film of the polyoxadiazole derivative represented by the formula (I), by regulating the pressure inside the vapor deposition chamber to $10^{-2}$–$10^{-4}$ Pa in the step (c) and by regulating the temperatures of the vapor sources having the respective monomers for condensation polymerization placed therein to 40–400° C. in the step (e) so that the monomers placed in the vapor sources are evaporated at a rate of at least $10^{-10}$ mol/sec·cm².

As the monomers for consdensation polymerization exhibiting the above characteristics, there may be mentioned dicarboxylic acid derivatives represented by the formula (V), each having as $X_0$ a divalent organic group with 2 to 50 carbon atoms containing an alkylene group or an aromatic ring, and dihydrazide compounds represented by the formula (VI), each having as $Y_0$ the same divalent organic group as had by $X_0$.

In particular, examples of suitable $X_0$ and $Y_0$ groups are as follows.

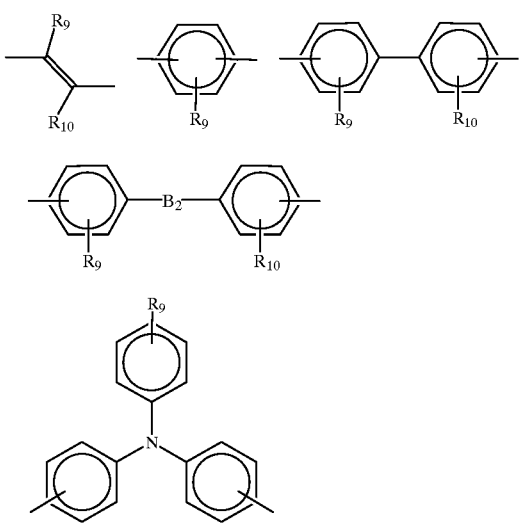

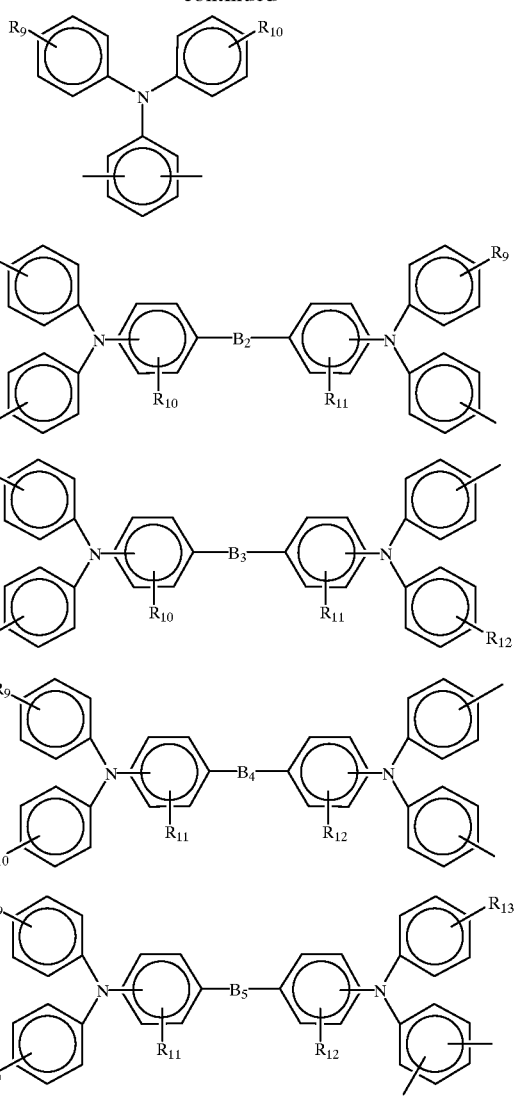

In the above formulae, each of $R_9$ to $R_{13}$ independently represents an unsubstituted or substituted alkyl group, allyl group, aryl group or aralkyl group. Each of $B_2$ to $B_5$ independently represents —$CH_2$—, —$SiH_2$—, —O— or —S—. Of these, the hydrogen atoms of —$CH_2$— and —$SiH_2$— may each be substituted with an alkyl or aryl group.

In particular, when $X_0$ of the formula (V) and $Y_0$ of the formula (VI) are selected from the above examples of groups and $Z_1$ and $Z_2$ of the formula (V) are selected from the above examples of organic groups, and when the pressure inside the vapor deposition chamber is in the range of $10^{-2}$–$10^{-4}$ Pa at the time of vapor deposition and the temperatures of the vapor sources having the respective monomers for condensation polymerization placed therein are in the range of 40–400° C., the formation of the vapor deposition film in the step (e) can precisely be controlled without the incidental occurrence of strong acid hydrogen halides so that a desirable thin film of the polyoxadiazole derivative represented by the formula (I) can be obtained.

When the above-mentioned additives, such as those capable of electron injection and transport, capable of hole injection and transport and capable of electroluminescence, are to be introduced in the thin film from those for the carboxylic acid derivative represented by the formula (V) and for the dihydrazide compound represented by the formula (VI) in the step (b) and thereafter the steps (c) to (f) are carried out in the same manner as described above. Thus, the additives and the monomers undergo simultaneous vapor deposition, so that a desired thin film of the polyoxadiazole derivative represented by the formula (I) containing the additives can be obtained.

When the charge injecting/transporting layer (electron injecting/transporting layer 4 and/or hole injecting/transporting layer 5) of each of the thin-film electroluminescent devices 10 illustrated in FIGS. 2 to 4 is to be composed of a layer comprising a silicon-atom containing polymeric compound, the formation thereof is conducted in an appropriate manner complying with the properties of the silicon-atom containing polymeric compound.

For example, when the silicon-atom containing polymeric compound is the polyoxadiazole derivative represented by the formula (III), the thin film thereof is produced in the same manner as in the production of the thin film of the polyoxadiazole derivative represented by the formula (I).

When the charge injecting/transporting layer (electron injecting/transporting layer 4 and/or hole injecting/transporting layer 5) of each of the thin-film electroluminescent devices 10 illustrated in FIGS. 2 to 4 comprises a silicon-atom containing polymeric compound and a polycondensed polymeric compound containing no silicon atom, the content of the silicon-atom containing polymeric compound decreasing from the electrode toward the electroluminescent layer while the content of the polycondensed polymeric compound containing no silicon atom increasing from the electrode toward the electroluminescent layer, the gradients of the contents of these compounds are created in an appropriate manner complying with the properties of the compounds.

For example, when the layer with the above content gradients is composed of polyoxadiazole derivatives, it is preferred that the carboxylic acid derivative represented by the formula (V) and the dihydrazide compound represented by the formula (VI) (provided that at least one, preferably both of $X_0$ of the formula (V) and $Y_0$ of the formula (VI) contain silicon atoms) be used as the monomers for polymerization to obtain the silicon-atom containing polyoxadiazole derivative and subjected to the vapor deposition polymerization, and that the carboxylic acid derivative represented by the formula (V) and the dihydrazide compound represented by the formula (VI) (provided that both of $X_0$ of the formula (V) and $Y_0$ of the formula (VI) contain no silicon atom) be used as the monomers for polymerization to obtain the polyoxadiazole derivative containing no silicon atom and subjected to the vapor deposition polymerization.

When the layer in which the proportion of the polyoxadiazole derivative containing a silicon atom to the polyoxadiazole derivative containing no silicon atom is changed from the electrode 1 or 2 toward the electroluminescent layer 3 is produced, a technique is adopted in which, in the vapor deposition apparatus, the amount of evaporated silane monomer (the carboxylic acid derivative represented by the formula (V) containing a silicon atom and/or the dihydrazide compound represented by the formula (VI) containing a silicon atom) and the amount of evaporated nonsilane monomer (the carboxylic acid derivative represented by the formula (V) containing no silicon atom and/or the dihydrazide compound represented by the formula (VI) containing no silicon atom) are changed with the lapse of time.

As the method for changing the above evaporation amount with the lapse of time, there may be mentioned a method in which first the silane monomer is evaporated in the vapor deposition chamber under predetermined vacuum conditions and deposited on the electrode 1 or 2, the evaporation of the silane monomer is rapidly discontinued by closing a shutter in front of the vapor source having the monomer placed therein, and then immediately the nonsilane monomer is evaporated. Further, there may be mentioned a method in which the rate of evaporation of the silane monomer is gradually decreased to finally become nil while the rate of evaporation of the nonsilane monomer is gradually increased, and the like. An appropriate method is selected depending on the type of the plate, the types of the monomers, etc.

In the present invention, in producing the thin-film electroluminescent devices 10 illustrated in FIGS. 1 to 4, it is preferred that all of the steps from formation of an electrode on a plate until the formation of the counter electrode, i.e., the steps i) to v) be continuously performed in a single vapor deposition chamber, and that each of the steps i) to iv) before the formation of the counter electrode be followed without inflow of outside air into the vapor deposition chamber by the subsequent step.

The production of the thin-film electroluminescent device 10 in the above manner prevents the dust present in outside air from adhering to each of the layers formed between the electrodes 1, 2 to degrade the thin-film electroluminescent device 10. Also, it prevents the oxygen and moisture in outside air from being adsorbed onto each of the layers formed between the electrodes 1, 2 to thereby oxidize the electrode 1 and/or 2, the oxidation leading to degradation of the thin-film electroluminescent device 10.

The thus obtained electroluminescent device (EL device) according to the present invention emits light when a voltage is applied between the electrodes 1, 2. The applied voltage may be not only a direct current (DC) voltage but also a driving voltage having a waveform such as that of pulse or chopped wave. When pulse voltage is applied, the power consumption can markedly be saved as compared with the application of DC voltage. The EL device can also be utilized as a display device by driving the device with the voltage having a specific waveform as mentioned above.

Further, the EL device of the present invention can be utilized as a display device by the driving through a matrix electrode or a thin film transistor (TFT) electrode having a pattern as the negative electrode 1 (electrode for injecting electrons) or the positive electrode 2 (electrode for injecting holes).

The present invention provides a thin-film electroluminescent device which is excellent not only in electroluminescence properties and capability of charge injection and transport to exhibit high electroluminescence efficiency but also in durability, such as heat resistance.

EXAMPLES

Hereinbelow, the present invention will be described in greater detail with reference to the following Examples, which should not be construed as limiting the scope of the invention.

Example 1

Vapor Deposition Polymerization

An ITO-coated glass plate having a thickness of 1000 Å (manufactured by Hoya Corp.) was subjected to ultrasonic cleanings successively using acetone, deionized water, plate cleaner (Semicoclean, grade EL, produced by Furuuchi Kagaku), deionized water and isopropyl alcohol (IPA). From boiling isopropyl alcohol, the plate was taken out and dried.

The thus dried ITO-coated glass plate was mounted on a temperature-controllable plate holder disposed in a vapor deposition apparatus.

Then, 1 g of commercially available terephthaloyl dichloride (produced by Tokyo Kasei) and 1 g of commercially available terephthaloyl dihydrazide (produced by Wako Pure Chemical Industries, Ltd.) as monomers were placed in separate vapor sources in the vapor deposition apparatus.

The inside of the vapor deposition apparatus was evacuated to a pressure of $1 \times 10^{-3}$ Pa or below by an oil diffusion pump. In the beginning, a shutter disposed in front of the coated plate for isolating the coated plate from the vapor sources was closed, and, while keeping the shutter closed, the vapor sources were heated by the resistance heating method. Conditions were created for ensuring the evaporation of each of the monomers at a rate of $10^{-8}$ to $10^{-7}$ mol/sec·cm², and the shutter in front of the coated plate was opened. Thus, the vapor deposition of the monomers on the ITO-coated plate was carried out. When the thickness of the vapor deposition film on the coated plate reached 800 Å as measured by a quartz resonator film thickness meter, the shutter was again closed.

The plate holder was heated to a temperature of 300° C. to thermally treat the vapor deposition film-coated plate for 30 min. This treatment completed the polymerization of the above terephthaloyl dichloride and terephthaloyl dihydrazide.

Confirmation of Formation of Polymeric Thin Film of Poly(1,4-phenylene-2,5-oxadiazolylene)

The same operation as above was conducted on an Al plate having a thickness of 0.5 mm to thereby form a vapor deposition film (specimen) having a thickness of 1 μm.

An FT-IR spectrum of the specimen was taken by the reflection method. The spectrum showed the disappearances of absorption at 3212 cm⁻¹ characteristic of a hydrazide group (N—H stretching vibration) and of the C=O stretching vibration at 1666 cm⁻¹ of a carbonyl group. Further, the spectrum showed absorptions at 1478 and 1536 cm⁻¹ (—C=N— and >C=C< stretching vibrations) and at 1002 and 959 cm⁻¹ C=C—O—C= stretching vibration) ascribed to the oxadiazole ring. Thus, the formation of the oxadiazole ring was confirmed. The thin film was dissolved in concentrated sulfuric acid only, but was not dissolved in organic solvents.

Thus, the formation of poly(1,4-phenylene-2,5-oxadiazolylene) by the polymerization of terephthaloyl dichloride and terephthaloyl dihydrazide was confirmed.

Preparation of Electroluminescent Device and Confirmation of Electroluminescence A counter electrode of MgAg alloy having a weight ratio of Mg to Ag of 10/1 was formed by codeposition on the polymeric thin film of poly(1,4-phenylene-2,5-oxadiazolylene) (electroluminescent device layer) superimposed on the ITO-coated glass plate.

Thus, a thin-film electroluminescent device 10 as illustrated in FIG. 1 was obtained. Using the ITO electrode and the MgAg electrode as a positive electrode 2 and a negative electrode 1, respectively, a direct current voltage of 7 V was applied between the electrodes 1, 2. The electroluminescent device emits produced blue electroluminescence (EL).

Example 2

A polymeric thin film of poly(1,4-phenylene-2,5-oxadiazolylene) was formed on an ITO-coated glass plate according to the vapor deposition polymerization process in the same manner as in Example 1, except that laser dye DCM was evaporated from a vapor source separate from those for the monomers and codeposited on the plate. The rate of evaporation and deposition of DCM was regulated so as for the content of DCM relative to the total amount of the deposited monomers in the polymeric thin film to be 0.05% by mole.

An MgAg electrode was formed by codeposition on the thus obtained polymeric thin film of poly(1,4-phenylene-2,5-oxadiazolylene) containing 0.05% by mole of DCM, thereby preparing an electroluminescent device.

Thus, a thin-film electroluminescent device 10 as illustrated in FIG. 1 was obtained. Using the ITO electrode as a positive electrode 2 and the MgAg electrode as a negative electrode 1, and a direct current voltage of 10 V was applied between the electrodes 1, 2. The electroluminescent device emits produced red electroluminescence (wavelength of 610 nm).

Example 3

A polymeric thin film of poly(1,4-phenylene-2,5-oxadiazolylene) was formed on an ITO-coated glass plate according to the vapor deposition polymerization process in the same manner as in Example 1, except that 4,4',4"-tris[N-(3-methylphenyl)-N-phenylamino]tri-phenylamine as a triphenylamine derivative having high hole transport capability was evaporated from a vapor source separate from those for the monomers and codeposited on the plate. The rate of evaporation and deposition of the triphenylamine derivative was regulated so as for the content of the triphenylamine derivative relative to the total amount of the deposited monomers in the polymeric thin film to be 7% by mole.

When the thickness of the vapor deposition film containing the triphenylamine derivative in an amount of 7% by mole relative to the total amount of the monomers was confirmed to be 300 Å by a quartz resonator film thickness meter, the deposition of the triphenylamine derivative was stopped.

Thereafter, the deposition of the monomers only was continued until it was stopped when the total thickness of the vapor deposition film was 800 Å.

Thermal treatment was conducted under the same conditions as in Example 1 to complete the polymerization reaction. An MgAg electrode was formed by codeposition on the thus obtained polymeric thin film, thereby preparing an electroluminescent device.

Thus, a thin-film electroluminescent device 10 as illustrated in FIG. 1 was obtained. Using the ITO electrode as a positive electrode 2 and the MgAg electrode as a negative electrode 1, and a direct current voltage was applied between the electrodes 1, 2. The electroluminescent device emits produced blue electroluminescence. The voltage at which electroluminescence started was lower than that of the electroluminescent device in which the triphenylamine was contained. The electroluminescence brightness of the device at the same voltage was higher to show improvement in electroluminescence efficiency.

Example 4

Vapor Deposition Polymerization

The same cleaned ITO-coated glass plate as in Example 1 was mounted on a temperature-controllable plate holder disposed in a vapor deposition apparatus.

Then, 1 g of commercially available 4,4'-biphenyldicarbonyl dichloride and 1 g of commercially available terephthaloyl dihydrazide (produced by Wako Pure Chemical Industries, Ltd.) as monomers were placed in separate vapor sources in the vapor deposition apparatus.

The inside of the vapor deposition apparatus was evacuated to a pressure of $1\times10^{-3}$ Pa or below by an oil diffusion pump. In the beginning, a shutter disposed in front of the coated plate for isolating the coated plate from the vapor sources was closed, and, while keeping the shutter closed, the vapor sources were heated by the resistance heating method. Conditions were created for ensuring the evaporation of each of the monomers on the coated plate at a rate of $10^{-8}$ to $10^{-7}$ mol/sec.cm$^2$, and the shutter in front of the coated plate was opened. Thus, the vapor deposition of the monomers on the ITO-coated plate was carried out. When the thickness of the vapor deposition film on the coated plate reached 800 Å as measured by a quartz resonator film thickness meter, the shutter was again closed.

The plate holder was heated to a temperature of 300° C. to thermally treat the vapor deposition film-coated plate for 30 min. This treatment completed the polymerization of the above 4,4'-biphenyldicarbonyl dichloride and terephthaloyl dihydrazide.

Confirmation of Formation of Polymeric Thin Film of Poly(4',4-biphenylene-2,5-oxadiazolylene-1,4-phenylene-2,5-oxadiazolylene)

The same operation as above was conducted on an Al plate having a thickness of 0.5 mm to thereby form a vapor deposition film (specimen) having a thickness of 1 μm.

An FT-IR spectrum of the specimen was taken by the reflection method. The spectrum showed the disappearances of absorption at 3212 cm$^{-1}$ characteristic of a hydrazide group (N—H stretching vibration) and of the C=O stretching vibration of a carbonyl group at 1666 cm$^{-1}$. Further, the spectrum showed absorptions ascribed to the oxadiazole ring (1478, 1536, 1002, 959 cm$^{-1}$). Thus, the formation of the oxadiazole ring was conrimed. The FT-IR spectrum of the thin film obtained by the above vapor deposition polymerization agreed with that of a thin film obtained by the solution polymerization technique.

Thus, the formation of poly(4',4-biphenylene-2,5-oxadiazolylene-1,4-phenylene-2,5-oxadiazolylene) by the polymerization of 4,4'-biphenyldicarbonyl dichloride and terephthaloyl dihydrazide was confirmed.

Preparation of Electroluminescent Device and Confirmation of Electroluminescence A counter electrode of MgAg alloy having a weight ratio of Mg to Ag of 10/1 was formed by codeposition on the polymeric thin film of poly(4',4-biphenylene-2,5-oxadiazolylene-1,4-phenylene-2,5-oxadiazolylene) (electroluminescent device layer) superimposed on the ITO-coated glass plate to thereby prepare an electroluminescent device.

Thus, a thin-film electroluminescent device 10 as illustrated in FIG. 1 was obtained. Using the ITO electrode as a positive electrode 2 and the MgAg electrode as a negative electrode 1, and a direct current voltage of 7 V was applied between the electrodes 1, 2. The electroluminescent device emits produced blue electroluminescence (EL).

Example 5

An electroluminescent device was produced in the same manner as in Example 2, except that poly(4',4-biphenylene-2,5-oxadiazolylene-1,4-phenylene-2,5-oxadiazolylene) was employed in place of the poly(1,4-phenylene-2,5-oxadiazolylene).

Thus, a thin-film electroluminescent device 10 as illustrated in FIG. 1 was obtained. Using the ITO electrode as a positive electrode 2 and the MgAg electrode as a negative electrode 1, and a direct current voltage of 10 V was applied between the electrodes 1, 2. The electroluminescent device produced emits red electroluminescence (wavelength of 610 nm).

Example 6

An electroluminescent device was produced in the same manner as in Example 3, except that poly(4',4-biphenylene-2,5-oxadiazolylene-1,4-phenylene-2,5-oxadiazolylene) was employed in place of the poly(1,4-phenylene-2,5-oxadiazolylene).

Thus, a thin-film electroluminescent device 10 as illustrated in FIG. 1 was obtained. Using the ITO electrode as a positive electrode 2 and the MgAg electrode as a negative electrode 1, and a direct current voltage was applied between the electrodes 1, 2. The electroluminescent device emits produced blue electroluminescence. The voltage at which electroluminescence started was lower than that of the electroluminescent device in which the triphenylamine was contained. The electroluminescence brightness of the device at the same voltage was higher to show improvement in electroluminescence efficiency.

Example 7

Vapor Deposition Polymerization

The same cleaned ITO-coated glass plate plate as in Example 1 was mounted on a temperature-controllable plate holder disposed in a vapor deposition apparatus.

Then, 1 g of 5-diphenylamino-isophthaloyl chloride, 1 g of 5-tert-butylisophthaloyl chloride and 1 g of terephthaloyl dihydrazide (produced by Wako Pure Chemical Industries, Ltd.) as monomers were placed in separate vapor sources in the vapor deposition apparatus.

The inside of the vapor deposition apparatus was evacuated to a pressure of $1\times10^{-3}$ Pa or below by an oil diffusion pump. In the beginning, a shutter disposed in front of the coated plate for isolating the coated plate from the vapor sources was closed, and, while keeping the shutter closed, the vapor sources were heated by the resistance heating method. First, conditions were created for ensuring the evaporation of each of 5-diphenylamino-isophthaloyl chloride and terephthaloyl dihydrazide on the coated plate at a rate of $10^{-8}$ to $10^{-7}$ mol/sec·cm$^2$, and the shutter in front of the coated plate was opened. Thus, the vapor deposition of the above monomers on the ITO-coated plate was carried out. When the thickness of the vapor deposition film on the coated plate reached 500 Å as measured by a quartz resonator film thickness meter, the shutter was again closed.

Subsequently, conditions were created for ensuring the evaporation of each of 5-tert-butylisophthalolyl chloride and terephthaloyl dihydrazide on the coated plate at a rate of $10^{-8}$ to $10^{-7}$ mol/sec·cm$^2$, and the shutter in front of the coated plate was opened. Thus, the vapor deposition of the above monomers on the ITO-coated plate was carried out. When the thickness of the vapor deposition film on the coated plate reached 500 Å as measured by a quartz resonator film thickness meter, the shutter was again closed.

The plate holder was heated to a temperature of 300° C. to thermally treat the vapor deposition film-coated plate for 30 min. This treatment completed the polymerization of the above 5-diphenylamino-isophthaloyl chloride and terephthaloyl dihydrazide and of the above 5-tert-butylisophthalolyl chloride and terephthaloyl dihydrazide.

Thus, two mutually different thin polyoxadiazole films were prepared on the ITO of the ITO-coated glass plate.

Confirmation of Formation of Two Mutually Different Thin Polyoxadiazole Films

The vapor deposition polymerization of 5-diphenylamino-isophthaloyl chloride and terephthaloyl dihydrazide was conducted on an Al plate having a thickness of 0.5 mm to thereby form a polymeric thin film having a thickness of 1 μm. Likewise, the vapor deposition polymerization of 5-tert-butylisophthaloyl chloride and terephthaloyl dihydrazide was conducted on an Al plate having a thickness of 0.5 mm to thereby form a polymeric thin film having a thickness of 1 μm.

FT-IR spectra of the specimen were taken by the reflection method. The spectra showed the disappearances of absorption at 3212 cm$^{-1}$ characteristic of a hydrazide group (N—H stretching vibration) and of the C=O stretching vibration of a carbonyl group at 1666 cm$^{-1}$ to thereby ensure the formation of oxadiazole rings. The FT-IR spectra of the thin films obtained by the above vapor deposition polymerization agreed with that of a thin film obtained by the solution polymerization technique.

Preparation of Electroluminescent Device and Confirmation of Electroluminescence A counter electrode of MgAg alloy having a weight ratio of Mg to Ag of 10/1 was formed by codeposition on the two mutually different thin polyoxadiazole films superimposed on the ITO of the ITO-coated glass plate to thereby prepare an electroluminescent device.

Thus, a thin-film electroluminescent device 10 as illustrated in FIG. 3 was obtained. Using the ITO electrode as a positive electrode 2 and the MgAg electrode as a negative electrode 1, and a direct current voltage of 10 V was applied between the electrodes 1, 2. The electroluminescent device produced emits blue-green electroluminescence (EL).

Example 8

The silane monomer represented by the formula:

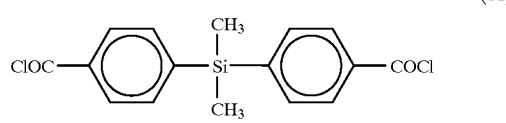

(S1)

i.e., bis(p-chlorocarbonylphenyl)dimethylsilane, was placed in a first vapor source in a vapor deposition polymerization apparatus. Further, commercially available 4,4'-biphenyldicarbonyl dichloride and terephthaloyl dihydrazide (produced by Wako Pure Chemical Industries, Ltd.) were placed in a second and a third vapor source, respectively in the vapor deposition polymerization apparatus.

A glass plate provided with an electrode of ITO (indium tin oxide), having a thickness of 1000 Å (manufactured by Hoya Corp.) was subjected to ultrasonic cleanings successively using acetone, superpurified water, plate cleaner (Semicoclean, grade EL, produced by Furuuchi Kagaku), superpurified water and isopropyl alcohol (IPA). From isopropyl alcohol vapor, the plate was taken out and dried. The resultant electroderovided glass plate was mounted on a temperature-controllable plate holder disposed in a vapor deposition polymerization apparatus.

The inside of the vapor deposition polymerization apparatus was evacuated to a total pressure of 1×10$^{-3}$ Pa or below by an oil diffusion pump. In the beginning, a shutter disposed in front of the coated plate for isolating the coated plate from the vapor sources was closed, and, while keeping the shutter closed, the vapor sources were heated by the resistance heating method. The respective temperatures of the vapor sources were set while monitoring the rates of evaporation of the monomers from the respective vapor sources.

Shutters for the vapor sources were opened, and the vapor deposition was conducted under the control such that the silane monomer and the terephthaloyl dihydrazide were simultaneously evaporated at at 10$^{-8}$ to 10$^{-7}$ mol/sec·cm$^2$ and deposited on the electrode-provided glass plate.

When the thickness of the vapor deposition film on the plate reached 150 Å as measured by a quartz resonator film thickness meter, the shutter for the silane monomer was again closed.

Concurrently, the shutter for the 4,4'-biphenyldicarbonyl dichloride vapor source was opened to start evaporation thereof. At this time, the rates of evaporation of terephthaloyl dihydrazide and 4,4'-biphenyldicarbonyl dichloride were set at 10$^{-8}$–10$^{-7}$ mol/sec·cm$^2$. When the thickness of the vapor deposition film on the above vapor deposition film reached 600 Å, all the shutters for the vapor sources were closed.

The plate holder was heated to a temperature of 300° C. to thermally treat the thus formed three vapor deposition films for 30 min. This treatment completed the polymerization reactions.

(1) Confirmation of Formation of Poly(4,4'-biphenylene-2,5-oxadiazolylene) by Polymerization of 4,4'-biphenyldicarbonyl Dichloride and Terephthaloyl Dihydrazide The same vapor deposition polymerization of 4,4'-biphenyldicarbonyl dichloride and terephthaloyl dihydrazide as above was conducted on an Al plate having a thickness of 0.5 mm to thereby form a vapor deposition polymerization film (specimen) having a thickness of 1 μm.

An FT-IR spectrum of the specimen was taken by the reflection method. The spectrum showed the disappearances of absorption at 3212 cm$^{-1}$ characteristic of a hydrazide group (N—H stretching vibration) and of the C=O stretching vibration of a carbonyl group at 1666 cm$^{-1}$ and further showed the appearances of absorptions at 2857 cm$^{-1}$ ascribed to aromatic C—H, 1428–1560 cm$^{-1}$ ascribed to >C=N— or >C=C< and 1000–1025 and 952–975 cm$^{-1}$ ascribed to =C—O—C= to thereby ensure the formation of an oxadiazole ring.

Thus, the formation of poly(4.4'-biphenylene-2,5-oxadiazolylene) by the polymerization of 4,4'-biphenyldicarbonyl dichloride and terephthaloyl dihydrazide was confirmed.

(2) Confirmation of Formation of Polymer by Polymerization of the Above Silane Monomer, i,e., Di(p-chlorocarbonylphenyl)dimethylsilane and Terephthaloyl Dihydrazide A specimen was prepared in the same manner as in item (1) above. An FT-IR spectrum of the specimen was taken by the reflection method. The spectrum showed the disappearances of the N—H stretching vibration at 3212 cm$^{-1}$ characteristic of a hydrazide group and of the C=O stretching vibration of a carbonyl group at 1795 cm$^{-1}$ and further showed the appearances of absorptions at 2857 cm$^{-1}$ ascribed to aromatic C—H, 1428–1560 cm$^{-1}$ ascribed to >C=N— or >C=C< and 1000–1025 and 952–975 cm$^{-1}$ ascribed to =C—O—C= to thereby ensure the formation of an oxadiazole ring.

Thus, the formation of a polymer by the polymerization of di(p-chlorocarbonylphenyl)dimethylsilane and terephthaloyl dihydrazide was confirmed.

In the evaporation of the monomers, the rates of evaporation of the monomers were regulated so as to form a stoichiometric thin film, and especially controlled so as for the total molar amount of the silane monomer and the terephthaloyl dichloride to be equal to the molar amount of the terephthaloyl dihydrazide.

The surface of each of the thus formed vapor deposition films was observed by a scanning electron microscope (SEM). The observation showed that the films were excellent in flatness and were thin films free of pin holes.

A counter electrode of MgAg alloy having a weight ratio of Mg to Ag of 10/1 was formed by codeposition on the electroluminescent layer superimposed on the electrode-provided glass plate to thereby obtain an electroluminescent device.

This electroluminescent device (sample) was electrically connected using the ITO electrode as a positive electrode and the MgAg electrode as a negative electrode, and a direct current voltage of 8 V was applied. The electroluminescent layer produced electroluminescence (EL) having a peak wavelength at 450 nm. This electroluminescent device was continuously driven at room temperature for 50 hr, but no peeling occurred at any of the interfaces of the ITO electrode, the layer comprising the silicon-atom containing polymeric compound and the electroluminescent layer.

In the above electroluminescent device, the thickness of the layer comprising the silicon-atom containing polymeric compound (layer with content gradient) sandwiched between the ITO electrode and the electroluminescent layer composed of poly(1,4-phenyl-ene-2,5-oxadiazolylene) was 150 Å, the thickness of the electroluminescent device layer composed of poly(1,4-phenyl-ene-2,5-oxadiazolylene) 600 Å and the thickness of the MgAg electrode 1000 Å.

Example 9
Production of Thin-film Electroluminescent Device Comprising Electroluminescent Device Layer in which Ratio in Content of Silicon-containing Polymer to Polycondensed Polymer Has Gradient The silane monomer represented by the formula (S1) and the following silane monomer represented by the formula:

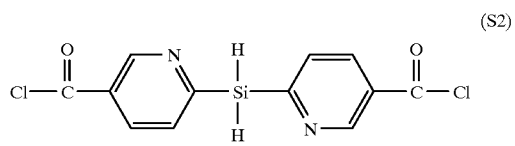

(S2)

i.e., bis(p-chlorocarbonylpyridyl)silane, terephthaloyl dichloride and terephthaloyl dihydrazide were put in separate vapor sources.

The electrode-provided glass plate having been cleaned in the same manner as in Example 1 was mounted on a temperature-controllable plate holder disposed in a vapor deposition polymerization apparatus. The inside of the vapor deposition polymerization apparatus was evacuated to a total pressure of $1 \times 10^{-3}$ Pa or below by an oil diffusion pump. In the beginning, a shutter disposed in front of the plate for isolating the plate from the vapor sources was closed, and, while keeping the shutter closed, the vapor sources were heated by the resistance heating method. The respective temperatures of the vapor sources were set while monitoring the rates of evaporation of the monomers from the respective vapor sources.

Shutters for the vapor sources were opened, and the vapor deposition was conducted under the control such that the silane monomer represented by the formula (S1) and the terephthaloyl dihydrazide were simultaneously evaporated at a rate of $10^{-8}$ to $10^{-7}$ mole/sec·cm² and deposited on the electrode-provided glass plate.

When the thickness of the vapor deposition film on the plate reached 50 Å as measured by a quartz resonator film thickness meter, all of the shutters were again closed.

Vapor deposition conditions were regulated so as for the total molar amount of the silane monomer represented by the formula (S1) and terephthaloyl dichloride to be equal to the molar amount of terephthaloyl dihydrazide. Then, all of the shutters for three of the vapor sources were opened. The mole ratio of the silane monomer represented by the formula (S1) and terephthaloyl dichloride was controlled to be changed continuously by gradual decreasing the evaporated amount of the silane monomer and increasing the evaporated amount of terephthaloyl dichloride while maintaining the total moles of the silane monomer and terephthaloyl dichloride being equal to the mole of terephthaloyl dihydrazide. When a vapor deposition film having a thickness of 200 Å was formed on the above vapor deposition film, all of the shutters were again closed.

The rates of evaporation of terephthaloyl dichloride and terephthaloyl dihydrazide were regulated, and the shutters therefor were opened. When a vapor deposition film having a thickness of 150 Å was formed, the shutters for the vapor sources were closed. Then, the total moles of the silane monomer represented by the formula (S2) and terephthaloyl dichloride were controlled to become equal to the mole of terephthaloyl dihydrazide, followed by opening the shutters for three of these vapor sources.

The mole ratio of the silane monomer represented by the formula (S2) was made to be continuously changed by increasing the mole ratio of the silane monomer to become only the silane monomer at the end while maintaining the total moles of the silane monomer and terephthaloyl dichloride being equal to the mole of terephthaloyl dihydrazide.

The plate holder was heated to a temperature of 300° C. to thermally treat the thus formed three vapor deposition films for 30 min. This treatment completed the polymerization reactions.

The formation of the polymers was confirmed in the same manner as in Example 8.

A MgAg electrode for injecting electrons was formed by codeposition on the electroluminescent layer superimposed on the electrode-provided glass plate to thereby obtain an electroluminescent device. This electroluminescent device (sample) was electrically connected using the ITO electrode as a positive electrode and the MgAg electrode as a negative electrode, and a direct current voltage of 10 V was applied. The electroluminescent layer produced electroluminescence (EL) having a peak wavelength at 450 nm. This electroluminescent device was continuously driven at room temperature for 40 hr, but no peeling occurred at any of the interfaces of the ITO electrode, the layer comprising the silicon-atom containing polymeric compound, the electroluminescent layer, the layer comprising the silicon-atom containing polymeric compound and the electrodes.

What is claimed is:

1. A thin-film electroluminescent device comprising an electroluminescent layer interposed between electrodes, at least one of which is transparent, wherein the electroluminescent layer comprises at least one polyoxadiazole derivative formed by the vapor deposition polymerization process, and represented by the formula:

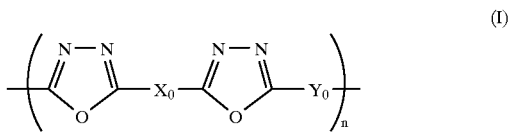

(I)

wherein each of $X_0$ and $Y_0$ independently represents a divalent organic group which may comprise a silicon atom, and n is an integer of 2 or greater.

2. A thin-film electroluminescent device comprising an electroluminescent layer interposed between electrodes, at least one of which is transparent, and a charge injecting/transporting layer interposed between at least one of the electrodes and the electroluminescent layer, wherein at least one of the electroluminescent layer and the charge injecting/transporting layer comprises at least one polyoxadiazole derivative formed by the vapor deposition polymerization process, represented by the formula:

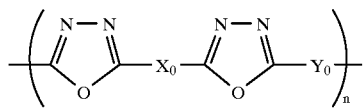

(I)

wherein each of $X_0$ and $Y_0$ independently represents a divalent organic group which may comprise a silicon atom, and n is an integer or 2 or greater.

3. The thin-film electroluminescent device as claimed in claim 2, wherein the electroluminescent layer comprises at least one polyoxadiazole derivative formed by the vacuum deposition polymerization process, represented by the formula:

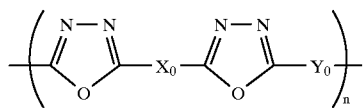

(I)

wherein each of $X_0$ and $Y_0$ independently represents a divalent organic group which may comprise a silicon atom, and n is an integer of 2 or greater, and wherein the charge injecting/transporting layer comprises at least one polyoxadiazole derivative formed by the vapor deposition polymerization process, represented by the formula:

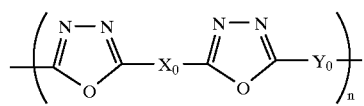

(II)

wherein each of $X_0$ and $Y_0$ independently represents a divalent organic group which may comprise a silicon atom, and n is an integer of 2 or greater,
provided that at least one of $X_0$ and $Y_0$ of formula (I) is different from both of $X_0$ and $Y_0$ of formula (II).

4. The thin-film electroluminescent device as claimed in claim 1 or 2, which emits a fluorescence having a wavelength of 400 to 600 nm.

5. The thin-film electroluminescent device as claimed in claim 1 or 2, wherein the electroluminescent layer comprises the polyoxadiazole derivative of the formula (I), and further comprising a fluorescent dye or pigment in an amount of 0.01 to 10% by mole per repeating unit of the polyoxadiazole derivative.

6. The thin-film electroluminescent device as claimed in claim 2, wherein the charge injecting/transporting layer comprises the polyoxadiazole derivative represented by the formula (I), and further comprising a charge injecting/transporting additive in an amount of 1 to 80% by mole per a repeating unit of the polyoxadiazole.

7. The thin-film electroluminescent device as claimed in claim 6, wherein said charge injecting/transporting additive is selected from the group consisting of diphenoquinone and fluorenone derivatives.

8. The thin-film electroluminescent device as claimed in claim 6, wherein said charge injecting/transporting additive is selected from the group consisting of 4,4',4"-tris(N,N-diphenylamino)triphenylamine, 4,4',4"-tris[N-(3-methylphenyl)-N-phenylamino]triphenylamine and other triphenylamine derivatives.

9. The thin-film electroluminescent device as claimed in claim 2, wherein the charge injecting/transporting layer comprises a silicon-atom containing polyoxadiazole derivative represented by the formula:

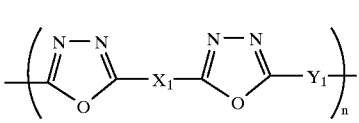

(III)

wherein each of $X_1$ and $Y_1$ independently represents a divalent organic group, at least one of $X_1$ and $Y_1$ being a divalent organic group having a silicon atom, and n is an integer of 2 or greater.

10. The thin-film electroluminescent device as claimed in claim 7, wherein the charge injecting/transporting layer comprises a silicon-atom containing polyoxadiazole derivative represented by the formula:

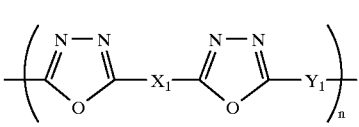

(III)

wherein $X_1$, $Y_1$, and n are as defined above, and a polyoxadiazole derivative containing no silicon atom represented by the formula:

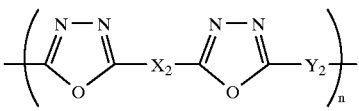

(IV)

wherein each of $X_2$ and $Y_2$ independently represents a divalent organic group containing no silicon atom, and n is an integer of 2 or greater, wherein the content of the silicon-atom containing polyoxadiazole derivative in the charge injecting/transporting layer decreases in the direction through the injecting/transporting layer from the electrode toward the electroluminescent layer, and wherein the content of the polyoxadiazole derivative containing no silicon atom increases in the direction through the injecting/transporting layer from the electrode toward the electroluminescent layer.

11. The thin-film electroluminescent device as claimed in claim 1, wherein each of $X_0$ and $Y_0$ independently represents a divalent aromatic group which may comprise a silicon atom.

12. The thin-film electroluminescent device as claimed in claim 2, wherein each of $X_0$ and $Y_0$ independently represents a divalent aromatic group which may comprise a silicon atom.

13. The thin-film electroluminescent device as claimed in claim 3, wherein each of $X_0$ and $Y_0$ independently represents a divalent aromatic group which may comprise a silicon atom.

14. The thin-film electroluminescent device as claimed in claim 11 or 12, wherein the electroluminescent layer comprises at least one polyoxadiazole derivative formed by the vacuum deposition polymerization process, represented by the formula:

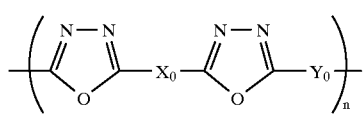

(I)

wherein each of $X_0$ and $Y_0$ independently represents a divalent organic group which may comprise a silicon atom, and n is an integer of 2 or greater, and wherein the charge injecting/transporting layer comprises at least one polyoxadiazole derivative formed by the vapor deposition polymerization process, represented by the formula:

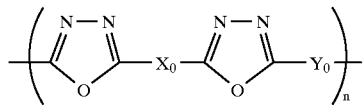

(II)

wherein each of $X_0$ and $Y_0$ independently represents a divalent organic group which may comprise a silicon atom, and n is an integer of 2 or greater, provided that at least one of $X_0$ and $Y_0$ of formula (I) is different from both of $X_0$ and $Y_0$ of formula (II).

15. The thin-film electroluminescent device as claimed in claim 11, 12 or 13 which emits a fluorescence having a wavelength of 400 to 600 nm.

16. The thin-film electroluminescent device as claimed in claim 11, 12 or 13 wherein the electroluminescent layer comprises the polyoxadiazole derivative of the formula (I), and further comprising a fluorescent dye or pigment in an amount of 0.01 to 10% by mole per repeating unit of the polyoxadiazole derivative.

17. The thin-film electroluminescent device as claimed in claim 11, 12 or 13 wherein the charge injecting/transporting layer comprises the polyoxadiazole derivative represented by the formula (I), and further comprises a charge injecting/transporting additive in an amount of 0.01 to 80% by mole per a repeating unit of the polyoxadiazole.

18. The thin-film electroluminescent device as claimed in claim 11, 12 or 13 wherein the charge injecting/transporting layer comprises a silicon-atom containing polyoxadiazole derivative represented by the formula:

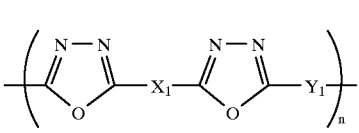

(III)

wherein each of $X_1$ and $Y_1$ independently represents a divalent organic group, with at least one of $X_1$ and $Y_1$ being a divalent organic group having a silicon atom, and n is an integer of 2 or greater.

* * * * *